United States Patent
Tomita et al.

(10) Patent No.: US 6,413,624 B1
(45) Date of Patent: Jul. 2, 2002

(54) OXIDE SUPERCONDUCTOR AND PROCESS FOR PRODUCING SAME

(75) Inventors: Masaru Tomita; Masato Murakami, both of Tokyo (JP)

(73) Assignees: International Superconductivity Technology Center; Railway Technical Research Institute, both of Tokyo (JP)

(*) Notice: Subject to any disclaimer, the term of this patent is extended or adjusted under 35 U.S.C. 154(b) by 0 days.

(21) Appl. No.: 09/521,271

(22) Filed: Mar. 8, 2000

(30) Foreign Application Priority Data

Mar. 9, 1999 (JP) .......... 11-061135
Jun. 22, 1999 (JP) .......... 11-175290

(51) Int. Cl.$^7$ .......... B23B 27/04
(52) U.S. Cl. .......... 428/306.6; 505/238
(58) Field of Search .......... 505/701, 730, 505/755, 238; 427/430.1, 62; 428/930, 304, 413, 306.6, 418

(56) References Cited

U.S. PATENT DOCUMENTS 5,167,715 A * 12/1992 Kalafala et al. .......... 118/712
6,083,886 A * 4/2000 Hayashi et al. .......... 505/450

FOREIGN PATENT DOCUMENTS

| JP | 61-222193 | 10/1986 |
| JP | 61-287190 | 12/1986 |
| JP | 63-260882 | 10/1988 |
| JP | 1-261286 | 10/1989 |
| JP | 1-282176 | 11/1989 |
| JP | 3-245558 | 11/1991 |
| JP | 403245558 A * | 11/1991 |
| JP | 5-78183 | 3/1993 |
| JP | 6-299087 | 10/1994 |

OTHER PUBLICATIONS

A. Malik et al. Effect of cryo–thermal cycles on polymer encapsulated YBCO superconductor—I (morphology). Polymer Degradation and Stability 56 (1997) 75–79.*

* cited by examiner

*Primary Examiner*—Tom Dunn
*Assistant Examiner*—Colleen P. Cooke
(74) *Attorney, Agent, or Firm*—Flynn, Thiel, Boutell & Tanis, P.C.

(57) ABSTRACT

An oxide superconductor is capable of assuring a high trapped magnetic field and maintaining its performance for a long period of time without being affected by internal or external forces, such as thermal strain or by corrosive environments. The oxide superconductor contains a resin impregnated layer incorporated with a filler material having a low value of linear thermal expansion coefficient, or contains the resin impregnated layer or a resin impregnated layer incorporated with a filler material and covered with a resin layer incorporated with the filler material having a low value of linear thermal expansion coefficient, or contains an oxide superconductive bulk body having an adhesively covering layer of resin impregnated fabric on the outside surface, or contains an oxide superconductive bulk body having on the surface thereof a resin or a resin-impregnated layer dispersedly incorporated with a filler material.

13 Claims, 7 Drawing Sheets

TRANSVERSE SECTIONAL VIEW

PLAN VIEW

ELEVATIONAL VIEW

LONGITUDINAL SECTIONAL VIEW

TRANSVERSE SECTIONAL VIEW

LONGITUDINAL SECTIONAL VIEW

TRANSVERSE SECTIONAL VIEW

OXIDE SUPERCONDUCTOR AND PROCESS FOR PRODUCING SAME

BACKGROUND OF THE INVENTION

1. Field of the Invention

The present invention relates to an oxide superconductor which is capable of trapping a high magnetic field and maintaining its performance for a long period of time without being affected by internal or external forces such as an electromagnetic force or thermal stress or by corrosive environments, and also to a process for producing said oxide superconductor.

Regarding a superconducting material, which has a high critical current density as compared with an ordinary conducting material and is capable of passing a large electric current without any loss, research and development have vigorously been conventionally carried out on its application in the field of experimental equipment for nuclear fusion, superconductive MRI for medical diagnosis, magnetic levitation trains, electric generators, energy storage units, magnetometers and the like, and since there have been found metal oxide superconducting materials having a relatively high critical temperature (T) such as $LiTi_2O_3$, $Ba(Bi,Pb)O_3$ and $(Ba,K)BiO_3$ in recent years and there have successively been created copper oxide superconducting materials having such a relatively high (T) that had never been anticipated before, such as $(La,Sr)_2CuO_4$, $REBa_2Cu_3O_7$ (RE is a rare earth element), $Bi_2Sr_2Ca_2Cu_3O_{10}$, $Ti_2Ba_2Ca_2Cu_3O_{10}$ and $HgBa_2Ca_2Cu_3O_8$, the research has been spurred more.

A superconducting material has a high critical current density as compared with an ordinary conducting material, and thus is capable of passing a large electric current without any loss. However, it is known that in the case of passing such a large electric current, a material is sometimes destroyed, depending upon its strength, since a large electromagnetic force acts on the superconductor in question.

Accompanying the enhanced characteristics and large scale operation of relatively high temperature bulk superconductors (particularly, copper oxide superconductor), the magnitude of a magnetic field capable of being trapped in a bulk superconductor has recently been drastically enhanced, for instance, to the extent that a magnetic flux density exceeding 5 tesla (T) has come to be trapped (refer to "Superconductor Science and Technology" 11, 1998, pp. 1345 to 1347). Since the electromagnetic force applied to a superconductor increases with an increase in a trapped magnetic field, there has recently been brought about such a situation in that a restriction is imposed on a trapped magnetic field depending upon a material's strength. Under such circumstances, importance is attached to an improvement in mechanical properties rather than a further improvement in superconducting properties (refer to "Physica C" vol. 7, No. 9, 1991, pp. 4989 to 4994).

It being so, the following two proposals have been made as a means for reinforcing an oxide bulk superconductor.

One proposal includes a method in which Ag is added to a material in question. It is said that by taking such a measure, a remarkable improvement is brought about in the mechanical strength of an oxide bulk superconductor (refer to "Japanese Journal of Applied Physics" vol. 70, No. 9, 1991, pp. 4989 to 4994 and "Superconductor Science and Technology" 11, 1998, pp. 1345 to 1347).

The other proposal includes a method in which a compression strain is applied in advance to a material in question by fitting a bulk superconducting material with a metallic ring (refer to "Extended Abstract of ISTEC International Workshop" 1998, pp. 115 to 118). It is said that by taking such a measure, an improvement is brought about in the trapped magnetic field, since the tensile stress caused at the time of trapping the magnetic field is alleviated by the compression strain which was applied in advance, thereby suppressing the destruction of the material.

Nevertheless, the above-mentioned methods including the reinforcement with Ag addition and reinforcement with a metallic ring are desired to make further improvements in the aspects of workability and manufacturing cost. Moreover, the problem has been recognized in that the reinforced performance is deteriorated by long-term use under a corrosive environment.

SUMMARY OF THE INVENTION

To solve the problem described above, the inventors have researched repeatedly a method for readily providing at a low cost, an oxide superconductor which is capable of sufficiently withstanding internal or external forces, such as a large electromagnetic force or a thermal stress accompanying a sudden rise or drop in temperature at the time of use, and further capable of exhibiting a high trapped magnetic field for a long period of time without being adversely influenced by a corrosive environment and the findings as described as a)–f) hereinafter have been obtained at the midpoint of the research.

Other objects of the present invention will be obvious from the text of this specification hereinafter disclosed.

In these circumstances, intensive research and investigation were accumulated by the present inventors in order to achieve the above-mentioned objects. As a result, novel information and findings as described hereunder have been obtained.

(a) An oxide bulk superconductor is a ceramic in the state of pseudo-single crystal. It is difficult in practice to prevent microcracks or micropores from being internally included during the manufacture thereof.

(b) When such an oxide bulk superconductor is subjected to "a strong mechanical impact", "thermal impact due to sudden temperature variation", "a large electromagnetic force (Lorentz force)" or the like, a stress concentration occurs in the aforesaid microcracks or whereby the microcracks or micropores as starting points progress and expand to relatively large cracks.

(c) In the case where the oxide bulk superconductor is exposed for a long time in a corrosive atmosphere containing a large amount of moisture or carbon dioxide gas, the materials for the oxide bulk superconductor deteriorate, or a reaction phase is formed resulting in the generation of new cracks, which progress and expand to relatively large cracks.

(d) The aforesaid relatively large cracks, when being formed, inhibit the flow of the superconductive current, thus greatly decreasing the trapped magnetic field.

(e) However, even if an oxide bulk superconductor is one which has been believed that there is by no means any possibility of internal permeation of a coating material or the like because of an extremely high density due to its generally being produced by a melting method, contact with a resin in liquid form in an atmosphere of reduced pressure enables said superconductor to maintain a high trapped magnetic field. This is due to the mechanism that the resin permeates not only into the microcracks having openings on the surface, but also into the whole surface layer and, further, the inside of the bulk body through the microcracks having openings, whereby the corrosion resistance of the surface is markedly improved and besides, the mechanical strength of the bulk superconductor itself is drastically enhanced, thereby suppressing, to the utmost, internal forces, external stresses and the propagation of cracking due to corrosion.

(f) In addition, since there is not recognized at all a deterioration, due to the resin impregnation, of the superconductivity characteristics of the bulk body matrix, the above-mentioned method is an extremely advantageous means for improving the mechanical properties and corrosion resistance, while maintaining the excellent superconductivity characteristics of the oxide superconductor.

Such being the case, on the basis of the above-mentioned information and findings, the present inventors previously proposed an oxide superconductor which comprises an oxide superconductive bulk body (for instance, a copper oxide superconductive bulk body containing at least one rare earth element) having a resin-impregnated layer, as an oxide superconductor which is minimized in the generation of cracks due to an external force or internal stress, is hardly adversely influenced by a corrosive environment, and is capable of maintaining a high trapped magnetic field for a long period of time; and further proposed a process for producing the above mentioned oxide superconductor which comprises impregnating a resin into an oxide superconductive bulk body by bringing the resin in liquid form into contact with the bulk body preserved in an atmosphere of reduced pressure {(refer to Japanese Patent Application Laid-Open No. 361722/1988 (Heisei 10)}.

However, by the research and investigations continued thereafter by the present inventors, it has been clarified that an oxide superconductor comprising an oxide superconductive bulk body having a resin-impregnated layer relating to the previous proposal still involves a problem to be further improved as described hereunder.

That is to say, even an oxide superconductor which comprises an oxide superconductive bulk body having a resin-impregnated layer, and which exhibits a markedly high cracking resistance against mechanical shock and thermal stress, sometimes fails as the case may be, to sufficiently exert the expected working effect which is obtained by providing the resin-impregnated layer, and which is shown by the prevention of cracking and corrosion of the oxide superconductive bulk body, since microcracks are generated in the resin-impregnated layer during the time zone soon after cooling in the case where the superconductor is rapidly cooled to the critical temperature or lower.

The object of the present invention, taking into consideration the foregoing, is to establish a method for readily providing at a low cost, an oxide superconductor which is capable of further sufficiently eliminating the risk of crack generation due to a mechanical strain derived from a large electromagnetic force or due to a thermal strain accompanying a sudden rise or drop in temperature at the time of use, and at the same time, which is capable of maintaining a high trapped magnetic field for a long period of time whether under an ordinary environment or a corrosive environment.

In these circumstances, intensive research and investigation were performed by the present inventors in order to achieve the above-mentioned object. As a result, the facts as described in the following items (a) to (g) were elucidated.

(a) The previous proposal, that is, the generation of microcracks which is recognized as the case may be, in the resin-impregnated layer at the time of rapidly cooling the oxide superconductor having a resin-impregnated layer, is a phenomenon originating from the difference in thermal expansion coefficient (thermal contraction coefficient) between the oxide superconductive bulk body and the resin-impregnated layer. The resin-impregnated layer, which has a linear thermal expansion coefficient higher than that of the oxide superconductive bulk body, contracts to a greater extent at the time of cooling with the more possible result that said layer can no longer withstand the tensile stress arising therefrom, thus leading to final cracking. Therefore, it is indispensable to solve such a problem in order to sufficiently assure the effect on preventing the cracking.

(b) However the linear thermal expansion coefficient of said resin-impregnated layer can be lowered by dispersedly incorporating therein a filler material which has a low value of linear thermal expansion coefficient and is exemplified by quartz, calcium carbonate, alumina and glass. Thus by properly selecting the combination of the type and blending amount of a filler material, it is possible to realize a resin material having a linear thermal expansion coefficient almost the same as that of the oxide superconductive bulk body.

(c) It being so, when a resin layer dispersedly incorporated with the above-mentioned filler material having a low value of linear thermal expansion coefficient is formed on the outside surface of the oxide superconductor having a resin-impregnated layer as previously proposed, then said resin-impregnated layer is brought to a state wherein it is interposed between the oxide superconductive bulk body having a low value of linear thermal expansion coefficient and the resin layer which contains the filler material and has a low value of linear thermal expansion coefficient. Accordingly, the tensile stress generated at the time of rapid cooling is held down by the above two, thus suppressing the generation of cracking.

(d) In addition, when a resin dispersedly incorporated with the above-mentioned filler material having a low value of linear thermal expansion coefficient is directly impregnated into the oxide superconductive bulk body so that said bulk body is equipped with the resin-impregnated layer dispersedly incorporated with the above-mentioned filler material having a low value of linear thermal expansion coefficient, then, as is the case with the item (c), cracking or corrosion is no longer generated, thereby realizing an oxide superconductor capable of exhibiting a high trapped magnetic field for a long period of time.

(e) However, because of its increased viscosity, the resin dispersedly incorporated with the above-mentioned filler material having a low value of linear thermal expansion coefficient is difficult to form into a layer deeply impregnated into the oxide superconductive bulk body. In such a case, sufficient cracking and corrosion resistance can be imparted to an oxide superconductor by further covering the outside surface of the oxide superconductive bulk body having a resin-impregnated layer dispersedly incorporated with the above-mentioned filler material having a low value of linear thermal expansion coefficient with a resin dispersedly incorporated with the above-mentioned filler material having a low value of linear thermal expansion coefficient.

(f) On the one hand, relatively large cracks that are prone to be generated on the oxide superconductive bulk body with the lapse of time can be effectively prevented by wrapping and covering the outside surface thereof with woven or non-woven fabric of fibers (glass fiber, carbon fiber, ceramic fiber, metal fiber, polyamide-based synthetic high polymeric fiber, cotton fiber, silk fiber, wool fiber, etc.), and thereafter impregnating the fabric with a resin to form a layer covered with resin-impregnated fabric. The oxide superconductive bulk body, even when equipped with such a layer covered with resin-impregnated fabric, is entirely free from the deterioration in superconductive properties. By simultaneously employing the resin impregnation into the bulk body along with the formation of the layer covered with resin-impregnated fabric, it is made possible to more steadily suppress the propagation of cracking derived from an external force, internal stress or corrosion at the time of use.

(g) In the case of simultaneously employing the resin impregnation into the bulk body along with the formation of a layer covered with a resin-impregnated fabric, by dispersedly incorporating a filler material having a low value of linear thermal expansion coefficient, such as quartz, calcium carbonate, alumina and glass, in a resin material to be impregnated into the inside of the oxide superconductive bulk body, it is made possible to lower the linear thermal expansion coefficient of said resin material; and further by properly selecting the combination of the type and blending amount of the filler material, there is materialized a resin material having a linear thermal expansion coefficient almost the same as that of the oxide superconductive bulk body. In this case, by constituting the resin-impregnated layer to be formed inside the oxide superconductive bulk body, the impregnated resin layer dispersedly incorporated with the above-mentioned filler material having a low value of linear thermal expansion coefficient, it is made possible to completely clear the concern about the cracking of the resin-impregnated layer, the generation of which could not have been completely denied, said cracking being due to the difference in thermal expansion (contraction) coefficient between the resin-impregnated layer and the oxide superconductive bulk body. As a result, the above-mentioned advantage leads to a further enhancement of the stability of properties as well as reliability of the oxide superconductor.

The present invention, which has been accomplished on the basis of the aforesaid information and findings, provides the under-mentioned oxide superconductor and also a process for producing said oxide superconductor.

(1) An oxide superconductor comprising an oxide superconductive bulk body which has a resin-impregnated layer, and the outside surface of which is covered with a resin layer dispersedly incorporated with the above-mentioned filler material having a low value of linear thermal expansion coefficient.

(2) An oxide superconductor comprising an oxide superconductive bulk body which has on a surface portion thereof, a resin-impregnated layer dispersedly incorporated with a filler material having a low value of linear thermal expansion coefficient.

(3) An oxide superconductor comprising an oxide superconductive bulk body which has on a surface portion thereof, a resin-impregnated layer dispersedly incorporated with a filler material having a low value of linear thermal expansion coefficient, and the outside surface of which is covered with a resin layer dispersedly incorporated with the above-mentioned filler material having a low value of linear thermal expansion coefficient.

(4) The oxide superconductor as set forth in any of the preceding items, wherein the resin in the resin-impregnated layer comprises an epoxy base resin.

(5) The oxide superconductor as set forth in any of the preceding items, wherein the filler material is at least one member selected from the group consisting of quartz, calcium carbonate, alumina, hydrate alumina, glass, talc and calcined gypsum.

(6) A process for producing the oxide superconductor as set forth in any of the items (1), (4) and (5) which comprises impregnating a resin into an oxide superconductive bulk body by bringing the resin in liquid form and said bulk body preserved in an atmosphere of reduced pressure into contact with each other, and thereafter coating the resin-impregnated bulk body with a resin in liquid form, which is dispersedly incorporated with a filler material having a low value of linear thermal expansion coefficient.

(7) A process for producing the oxide superconductor as set forth in any of the items (2) and (5) which comprises impregnating a resin into an oxide superconductive bulk body by bringing the resin in liquid form, which is dispersedly incorporated with a filler material having a low value of linear thermal expansion, and said bulk body preserved in an atmosphere of reduced pressure into contact with each other.

(8) A process for producing the oxide superconductor as set forth in any of the items (2) and (5) which comprises impregnating a resin into an oxide superconductive bulk body by bringing the resin in liquid form, which is dispersedly incorporated with a filler material having a low value of linear thermal expansion coefficient, and said bulk body preserved in an atmosphere of reduced pressure into contact with each other, and thereafter coating the resin-impregnated bulk body with a resin in liquid form, which is dispersedly incorporated with a filler material having a low value of linear thermal expansion coefficient.

(9) An oxide superconductor comprising an oxide superconductive bulk body which has an adhesively covering layer of resin-impregnated fabric on the outside surface.

(10) The oxide superconductor as set forth in item (9), wherein the fabric constituting said adhesively covering layer comprises fibers selected from the group consisting of glass fiber, carbon fiber, ceramic fiber, metal fiber and polyamide-based synthetic high polymeric fiber.

(11) The oxide superconductor as set forth in item (9) or (10), wherein the oxide superconductive bulk body has on the surface portion thereof, a resin-impregnated layer.

(12) The oxide superconductor as set forth in any of the items (9) through (11), wherein the resin in the resin-impregnated layer comprises an epoxy base resin.

(13) The oxide superconductor as set forth in any of the items (9) through (12), wherein the resin is dispersedly incorporated with a filler material having a low value of linear thermal expansion coefficient.

(14) A process for producing the oxide superconductor as set forth in any of the items (9) through (13), which comprises wrapping the surface of the oxide superconductive bulk body, and thereafter bringing the wrapped body preserved in an atmosphere of reduced pressure into contact with a resin in liquid form.

DESCRIPTION OF PREFERRED EMBODIMENT

Figure 1:
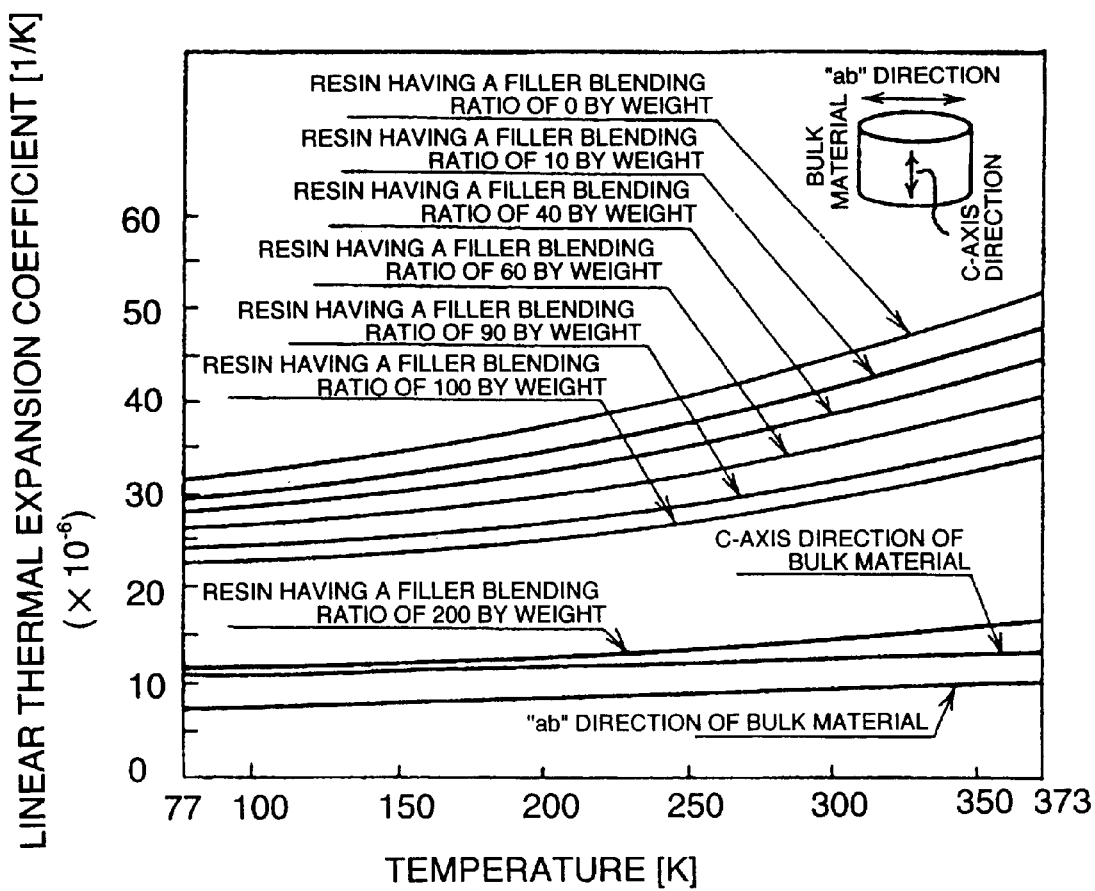
FIG. 1 is a graph illustrating the contradistinction of linear thermal expansion coefficients at various temperatures for $SmBa_2CuO_y$ based oxide superconductors in the directions of "ab" and c-axis, respectively, and for an epoxy base resin blended with fine powders of quartz at various ratios by weight.

The oxide superconductive bulk body to which the present invention is applied, may be any of hitherto known types thereof. Thus, mention may be made as a preferable oxide superconductive bulk body, of a copper oxide superconductive bulk body, such as an RE—Ba—Cu—O-based superconductor, which is known as a relatively high temperature superconductor having a high trapped magnetic field, wherein RE is at least one rare earth element selected from the group consisting of Y, La, Nd, Sm, Eu, Gd, Dy, Ho, Er, Tm and Yb.

Of these, mention may be made as a more preferable oxide superconductor, of an oxide superconductive bulk body which is known as a superconductor having a high trapped magnetic field, comprising $REBa_2Cu_3O_y$ as a parent phase, wherein RE is at least one rare earth element selected from the group consisting of Y, Dy, Ho, Er, Tm and Yb, and $RE_2BaCuO_5$ as a dispersion phase, wherein RE is at least one rare earth element selected from the group consisting of Y, Sm, Eu, Gd, Dy, Ho, Er, Tm and Yb in an amount of at most 50% by volume based on said parent phase; and of an oxide superconductive bulk body comprising $RE_{1+x}Ba_{3-x}Cu_3O_y$ as a parent phase, wherein RE is at least one rare earth element selected from the group consisting of La, Nd, Sm, Eu, and Gd, and preferably satisfies the relationships $-0.1<x<0.2$ and $6.5<y<7.2$, and $RE_{4-2x}Ba_{2+2x}Cu_{2-x}O_{10-2x}$ as a dispersion phase, wherein RE is at least one rare earth element selected from the group consisting of La and Nd, and preferably satisfies the relationship $-0.2<x<0.3$, or $RE_2BaCuO_5$ phase as a dispersion phase, wherein RE is at least one rare earth element selected from the group consisting of Sm, Eu, and Gd in an amount of at most 50% by volume based on said parent phase. The reason for the content of the dispersion phase being defined as at most 50% by volume is that the content of the dispersion phase exceeding 50% by volume reveals a tendency to deteriorate the superconductivity characteristics.

In addition, the incorporation of Ag, when necessary, into the oxide superconductive bulk body is advantageous in further enhancing its strength, and effective in maintaining a high trapped magnetic field. However, when the amount of Ag exceeds 40% by weight, the superconductivity properties tend to deteriorate. Accordingly, in the case of incorporating Ag into an oxide superconductive bulk body, the amount thereof is preferably suppressed to at most 40% by weight.

Suitable resins for impregnating into the oxide superconductor are exemplified by an epoxy-based resin, urea resin, phenolic resin, unsaturated polyester resin, polyurethane, alkyd resin, melamine resin and the like.

A method for impregnating a resin into the oxide superconductive bulk body, is preferably a method in which the resin in liquid form is brought into contact with the oxide superconductive bulk body maintained at a reduced pressure atmosphere, such as under a vacuum. However, there is also acceptable a method other than the foregoing, such as "a pressurized impregnation method", provided that the method in question enables resin impregnation.

At any rate, a method in which the surface of the oxide superconductive bulk body is only coated with the resin fails to impregnate the resin thereinto. This method, even if it possibly provides protection from a corrosive environment, fails to maintain a high trapped magnetic field for a long period of time.

A filler material to be dispersedly incorporated with the above-mentioned filler material having a low value of linear thermal expansion coefficient thereof is preferably a material which has a low value of linear thermal expansion coefficient, a high thermal conductivity, a low heat generation in curing a resin and a high mechanical strength. Such a filler material is exemplified by quartz, calcium carbonate, alumina, hydrate alumina, glass, talc and calcined gypsum.

Any of the filler materials, which is used by dispersing and incorporating it in the resin, is preferably in the form of fine powders so as to be uniformly dispersed.

The content of the filler material to be dispersedly incorporated in the resin is preferably regulated according to the linear thermal expansion coefficient of the objective oxide superconductive bulk body. Even a slight decrease in the linear thermal expansion coefficient of the resin material brings about an appreciable effect, however, the filler material is preferably incorporated in such an amount that the linear thermal expansion coefficient of the resin material is almost equalized to that of said bulk body.

FIG. 1 is a graph which shows the results of investigation on the linear thermal expansion coefficients of an $SmBa_2Cu_3O_y$ based oxide superconductive bulk body in the direction of "ab" and c-axis at each of a variety of temperatures, and in comparison therewith, of those of an epoxy resin (composed of 100 parts by weight of an epoxy resin of the bisphenol type A as the principal ingredient and 32 parts by weight of an aromatic polyamine as the curing agent) blended with fine powders of quartz as the filler material at various ratios by weight on the basis of the epoxy resin of the bisphenol type A at each of a variety of temperatures. It can be seen from FIG. 1 that as the blending ratio of the filler material increases, the linear thermal expansion coefficient of the resin material comes close to that of the oxide superconductive bulk body, and also that at a blending ratio of the filler material of approximately 200 parts by weight based thereon, the linear thermal expansion coefficient of the resin material is almost equalized to that of said bulk body.

In the case where the resin, which is dispersedly incorporated with the filler material, is impregnated into the oxide superconductive bulk body, it is possible to adopt a method comprising bringing said resin in liquid form and said bulk body preserved in an atmosphere of reduced pressure, such as a vacuum, into contact with each other, and to adopt a pressurized impregnation method.

On the one hand, in the case where the layer of the resin dispersedly incorporated with the filler material is installed on the outside surface of the oxide superconductive bulk body having the resin-impregnated layer, there may be applicable a method comprising coating said resin dispersedly incorporated with the filler on the outside surface thereof.

As the resin material to be applied in this case, there are suitably usable thermosetting resins such as the epoxy base resin used as the resin material for impregnation as mentioned above, urea resin, phenolic resin, unsaturated polyester resin, polyurethane resin, alkyd resin and melamine resin.

As the coating method, there is preferably used a method comprising immersing the oxide superconductive bulk body having the resin-impregnated layer into the resin, which is dispersedly incorporated with a filler material, so that the resin adheres to said bulk body, more preferably a method comprising bringing said resin dispersedly incorporated with a filler material and the oxide superconductive bulk body preserved in an atmosphere of reduced pressure into contact with each other by means of an immersion method. By allowing the liquid resin containing the filler material to adhere to said bulk body, bubbles possibly accompanying the filler material can be removed therefrom, thereby enabling the formation of a sound resin-covered layer free from pinholes or the like.

On the one hand, in the case of covering the outside surface of the oxide superconductive bulk body with a resin-impregnated fabric, there is usable as the fabric constituting the covering layer, any of a woven fabric and non-woven fabric (including the laminated fabric by uniformizing the direction of fibers) without specific limitation of the material itself (Japanese paper and non-woven fabric fall within the scope of usable materials). Taking into consideration the strength, chemical resistance and the like, however, it can be said that examples of preferable raw material for the fabric include glass fiber, carbon fiber, ceramic fiber ($Al_2O_3$ fiber, SiC fiber, Si—C—O fiber, $SiO_2$ fiber, Si—Ti—C—N—O fiber and the like), metallic fiber (titanium fiber, aluminum fiber and the like) and polyamide-based synthetic high-polymeric fiber.

In particular, it is believed that the polyamide based synthetic high-polymeric fiber is a particularly preferable material with respect to the fact that since it has a relatively high contraction coefficient when cooled to a low temperature, the resultant contraction force suppresses the electromagnetic expansion force (Lorentz force) caused on the oxide superconductive bulk body, thereby more effectively inhibiting the propagation of microcracks.

Figure 2:
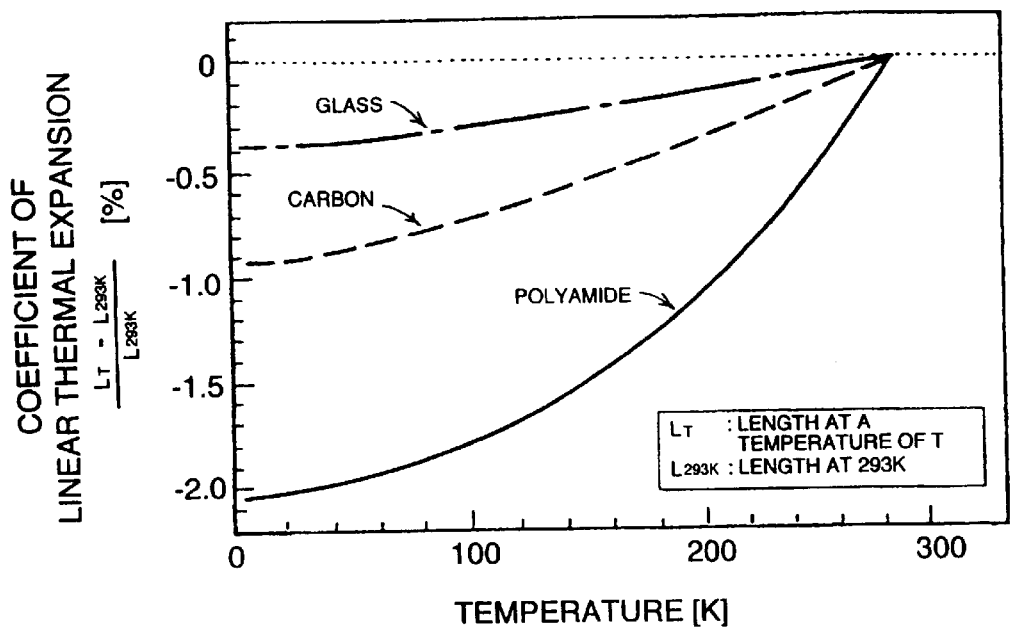
FIG. 2 is a graph illustrating the contradistinction of linear thermal expansion coefficient (contraction coefficient at low temperatures) for glass, carbon and polyamide.

In this connection, FIG. 2 is a graph illustrating the contradistinction of contraction coefficients at low temperatures for glass, carbon and polyamide.

In particular, it has been confirmed that glass fiber has a linear thermal expansion coefficient almost the same as that of a Y—Ba Cu—O-based oxide superconductive bulk body in the direction of the c-axis and, besides, carbon fiber has a linear thermal expansion coefficient almost the same as that of a Y—Ba Cu—O-based oxide superconductive bulk body in the direction of the ab plane.

In addition, suitable resins to be impregnated into the covering layer of fabric are thermosetting resins such as an epoxy base resin, urea resin, phenolic resin, unsaturated polyester resin, polyurethane resin, alkyd resin and melamine resin.

As the method for impregnating the resin into said covering layer of fabric, there is preferably used a method comprising bringing a resin in liquid form and the oxide superconductive bulk body, which is wrapped and covered with fabric and which is preserved in an atmosphere of reduced pressure such as vacuum, into contact with each other. Another method, such as the pressurized impregnation method, however, is acceptable, if resin impregnation is possible.

In preparing the oxide superconductor according to the present invention comprising the oxide superconductive bulk body which has the resin-impregnated covering layer of fabric on the outside surface thereof, and which has the resin-impregnated layer on the surface portion of said covering layer, there is adopted a method wherein, in the first place, the oxide superconductive bulk body in an atmosphere of reduced pressure or increased pressure is brought into contact with a resin in liquid form to carry out a treatment of resin impregnation in the surface portion thereof, thereafter, the bulk body is tightly wrapped with the fabric, and then the fabric layer of the bulk body thus wrapped is impregnated with the resin. It is more advantageous from the standpoint of production efficiency, however, to adopt a method wherein both the covering layer of fabric and the surface portion of the oxide superconductive bulk body are simultaneously impregnated with the resin in one step by bringing the bulk body, the surface of which is wrapped with the fabric, into contact with the resin in liquid form, while preserving it in an atmosphere of reduced pressure.

In this case, by regulating the period of time of contact with the resin in liquid form, it is made possible to selectively impregnate the covering layer of fabric alone or both the covering layer of fabric and the inside of the oxide superconductive bulk body.

Needless to say, there is no problem or disadvantage with the performance of the objective oxide superconductor, even when the aforesaid filler material is dispersed in the covering layer of fabric which is impregnated with the resin.

As described hereinbefore, the present invention provides at a low cost, an oxide superconductor which is endowed with sufficient corrosion resistance and mechanical characteristics that are capable of sufficiently withstanding internal or external forces such as a large electromagnetic force or a thermal stress accompanying a sudden rise or drop in temperature at the time of use, and further capable of exhibiting a high trapped magnetic field for a long period of time. Accordingly, the present invention renders itself highly useful in the case of, for instance, putting the oxide superconductive bulk body into practice under a high electromagnetic force, or utilizing the oxide superconductive bulk body as a high-temperature superconductive magnet by allowing it to trap a magnetic field.

In addition, the incorporation of any of the resin-impregnated layer, resin-coated layer and covering layer of fabric impregnated with a resin into the oxide superconductive bulk body, leads to the working effects not only of suppressing the generation and propagation of cracks originating from micropores or microcracks that are formed at the time of manufacturing the bulk body, and preventing corrosion, but also on alleviating direct mechanical impact applied from outside. In particular, according to the present invention, it is made possible to markedly enhance the working effects of preventing the generation of cracks due to rapid cooling at the time of using the oxide superconductor and, further, for suppressing for a long period of time, the situation of bringing about the deterioration of superconductivity properties. The above-described enhanced working effects are manifested by virtue of the specific countermeasure of covering the outside surface of the oxide superconductive bulk body with a resin layer dispersedly incorporated with a filler material having a low linear thermal expansion coefficient; incorporating a resin-impregnating layer dispersedly incorporated with a filler material having a low linear thermal expansion coefficient into the surface portion of said bulk body; or tightly adhesively covering the outside surface of said bulk body with a covering layer of a resin-impregnated fabric.

In summarizing the working effects and advantages of the present invention, the invention readily provides at a low cost, an oxide superconductor which brings about extremely useful working effects from the industrial aspect, including not only the enhancement of superconductive characteristics, such as assuring a high trapped magnetic field, but also the preservation of a high trapped magnetic field without deterioration, even in the case of use under a thermal history of repeated cooling and heating, under an electromagnetic history of repeated application of electromagnetic force, or in a corrosive environment for a long period of time.

In the following, the present invention will be described in further detail with reference to working examples, which however, shall never limit the present invention thereto.

EXAMPLE 1

There were prepared five kinds of bulk materials comprising $YBa_2Cu_3O_y$ as a superconductor and a $Y_2BaCuO_5$ phase dispersed therein in an amount of 0, 10, 20, 30, and 40% by volume, respectively by means of the melt-textured-growth (MTG) process.

For the MTG process, according to an ordinary method, each of the starting materials of $YBa_2Cu_3O_y$ was heated to 1100° C. for 20 minutes, thereafter cooled to 1050° C. for 30 minutes, and after placing $SmBa_2Cu_3O_y$ crystals therein as a seed, cooled to 900° C. at a cooling rate of 0.5° C./hr.

Melt-grown samples were annealed at 400° C. for 250 hours in a stream of oxygen at atmospheric pressure.

Subsequently, each of the bulk superconductors thus obtained was classified into the group without resin impregnation, the group impregnated with a resin in a vacuum vessel under the following condition (1), and the group impregnated with a resin in a vacuum vessel under the following condition (2).

Condition (1)—Bisphenol A type epoxy resin, quartz glass powder (amorphous powder having an average size of 15$\mu$) and an aromatic polyamine as the curing agent were mixed at a blending ratio by weight of 100:125:32, while preheating to 30° C., followed by deaeration under vacuum. Then the bulk superconductor was preheated to 70° C. and evacuated in a vacuum tank. The mixed resin was poured into the tank so as to cover the bulk body and cured by pressurizing over atmospheric pressure and heating at 80° C. for 6 hours and at 120° C. for 2 hours.

Condition (2)—Bisphenol A type epoxy, quartz glass powder (an amorphous powder having an average size of 15$\mu$) and an aromatic polyamine as the curing agent were mixed at a blending ratio by weight of 100:125:32, while preheating to 30° C. Then, the bulk superconductor was preheated to 70° C. The mixed resin was poured into the tank so as to cover the bulk body, followed by deaeration under vacuum in the tank. After sufficient defoaming, the impregnated resin was cured by heating under atmospheric pressure at 80° C. for 6 hours and at 120° C. for 2 hours.

The quartz glass powder which was used in conditions (1) and (2) was pulverized molten quartz glass which was vitrified (made amorphous) by completely melting highly pure quartz at 1900° C.

Figure 3:
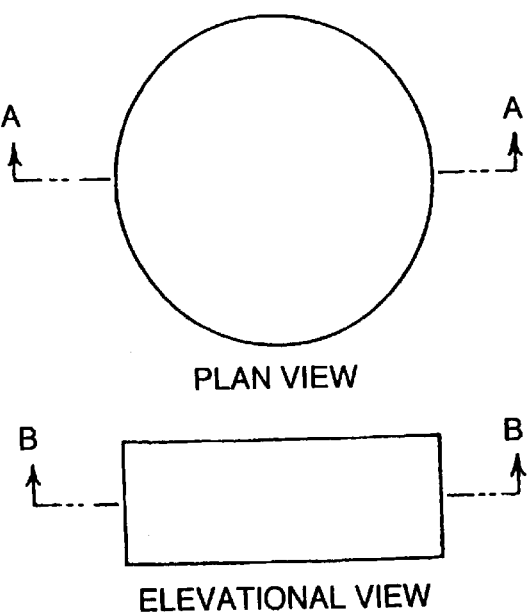
FIG. 3 is an explanatory illustration showing the configuration of the oxide superconductor obtained in Example 1.

Each of the oxide superconductors in any of the groups thus prepared had the configuration illustrated in FIG. 3.

Subsequently, each of the superconductors as samples was cooled to 100° K. A magnetic field with 10T was applied thereto at 100° K., then after cooling to 50° K., was gradually lowered, and finally removed. Thereafter, measurements were made of the magnetic field distribution on the surface of the sample by the use of a Hall sensor.

As a result, it was confirmed that all the samples that were not subjected to resin impregnation under vacuum, had been destroyed. On the other hand, the trapped magnetic field of the samples that were subjected to resin impregnation under vacuum, showed 2.5T, 3T, 4T, 4T, and 3T for the samples having contents of Y211 phase of 0, 10, 20, 30 and 40% by volume, respectively.

There was no difference in the values of the trapped magnetic field between the samples that were subjected to resin impregnation under the condition (1) and condition (2).

As a result of observation for the structure of the cross-section of the samples that were subjected to resin impregnation, it was confirmed that the filler-incorporated resin had been impregnated mainly into microcracks and micropores of the bulk material from the surface towards the inside, whereby the surface layer formed a resin-impregnated layer.

As mentioned above, cracks were observed in all the samples that were not subjected to resin impregnation under vacuum, but were not observed in all the samples that were subjected to a resin impregnation, the resin thereof being dispersedly incorporated with quartz glass powders as a filler, all of which had a relatively high trapped magnetic field. Needless to say, the difference in trapped magnetic field due to the difference in the content of Y211 phase, reflects the difference in the critical current density.

EXAMPLE 2

There were prepared five kinds of bulk materials comprising $Sm_{0.9}Ba_{2.1}Cu_3O_y$ as a superconductor and an $Sm_2BaCuO_5$ phase (Sm211 phase) dispersed therein in an amount of 0, 10, 20, 30, and 40% by volume, respectively by means of the oxygen-controller-melt-growth (OCMG) process.

For the OCMG process, each of the starting materials of $Sm_{0.9}Ba_{2.1}Cu_3O_y$ was heated to 1200° C. for 20 minutes in a flowing mixed gas of argon and oxygen having an oxygen partial pressure of 1%, thereafter cooled to 1050° C. for 20 minutes, and after placing $NdBa_2Cu_3O_y$ crystals therein as a seed, was cooled to 900° C. at a cooling rate of 0.5° C./hr.

During the course of the growth of crystals, large cracks were found in the samples having Sm211 phase contents of 0 and 10% by volume, and cracks, although not found visually, were observed in the sample having an Sm211 phase content of 20% by volume.

The samples in the form of a bulk superconductor having Sm211 phase contents of 30 and 40% by volume, wherein no cracks were recognized, were annealed at 350° C. for 200 hours in flowing oxygen at atmospheric pressure.

Subsequently, each of the bulk superconductors thus obtained was classified into a group without resin impregnation, a group impregnated with a resin in a vacuum vessel under the following condition (3), and a group impregnated with a resin in a vacuum vessel under the following condition (4).

Condition (3)—Bisphenol A type epoxy resin and an aromatic polyamine as the curing agent were mixed at a blending ratio by weight of 100:32, while preheating to 30° C., followed by deaeration under vacuum. Then, the bulk superconductor was preheated to 70° C. and evacuated in a vacuum tank. The mixed resin was poured into the tank so as to cover the bulk body and cured by pressurizing over atmospheric pressure and heating at 80° C. for 6 hours and at 120° C. for 2 hours.

Condition (4)—Bisphenol A type epoxy and an aromatic polyamine as the curing agent were mixed at a blending ratio by weight of 100:32, while preheating to 30° C. Then, the bulk superconductor was preheated to 70° C. The mixed resin was poured into the tank so as to cover the bulk body, followed by deaeration under vacuum in the tank. After sufficient defoaming, the impregnated resin was cured by heating under atmospheric pressure at 80° C. for 6 hours and at 120° C. for 2 hours.

Each oxide superconductive bulk body that had been subjected to the resin impregnation treatment was smoothened on the surface thereof by slightly grinding the outside surface. The oxide superconductive bulk body having the resin-impregnated layer was again placed in a vacuum vessel and covered on the outside surface with a filler-incorporated resin layer with a thickness of 1 mm under conditions same as condition (2) in Example 1.

Subsequently, each of the superconductors as samples that were subjected to resin impregnation and covering treatment and the samples that were not subjected to resin impregnation and covering treatment was rapidly cooled to 100° K. A magnetic field of 10T was applied thereto at 100° K., then after cooling to 50° K., was gradually lowered, and finally removed. Thereafter, measurements were made of the magnetic field distribution on the surface of the sample by the use of a Hall sensor.

As a result, it was confirmed that all the samples that were not subjected to resin impregnation under vacuum and covering treatment, were destroyed. On the other hand, the trapped magnetic field of the samples that were subjected to resin impregnation under vacuum and covering treatment, showed high values of 8T and 6.5T, for the samples having contents of an Sm211 phase of 30 and 40% by volume, respectively.

There was no difference in the values of the trapped magnetic field between the samples that were subjected to resin impregnation under the condition (3) and condition (4).

As the result of observation for the structure of the cross-section of the samples that were subjected to resin impregnation and covering treatment, it was confirmed that the resin had been impregnated mainly into microcracks and micropores of the bulk material from the surface towards the inside, whereby a resin-impregnated surface layer was formed, and further, the outside surface thereof was covered with a resin layer dispersedly incorporated with quartz glass powders (filler).

Figure 4:
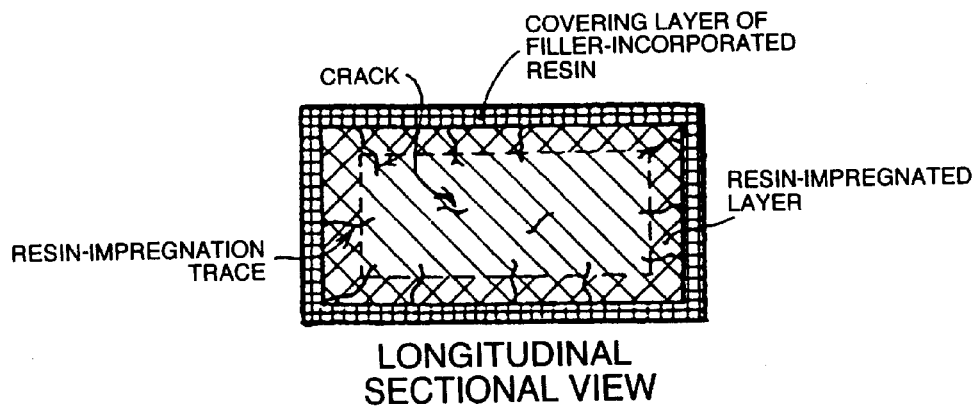
FIG. 4 is a schematic view showing the observed state taken along a longitudinal cross-section of the oxide superconductor obtained in Example 2.
Figure 5:
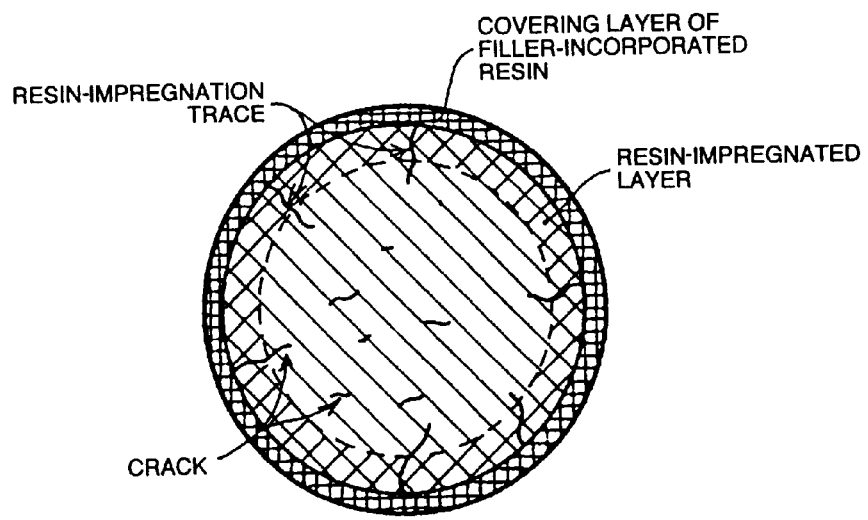
FIG. 5 is a schematic view showing the observed state taken along a lateral cross-section of the oxide superconductor obtained in Example 2.

FIG. 4 is a schematic view for the observed state of the longitudinal sectional view (equivalent to sectional view taken on line A—A in the foregoing FIG. 3) for the sample of the oxide superconductor as obtained in this example, and FIG. 5 is a schematic view for the observed state of the transverse sectional view (equivalent to sectional view taken on line B—B in the foregoing FIG. 3) for the sample of the oxide superconductor as obtained in this example.

As mentioned above, cracks were observed in all the samples that were not subjected to resin impregnation under vacuum, but were not observed in all the samples that were subjected to resin impregnation under vacuum and covering treatment, all of which had relatively high trapped magnetic fields.

The difference in trapped magnetic field due to the difference in the content of Sm211 phase, reflects the difference in the critical current density. In addition, the excellent critical current characteristics of the Sm-based superconductor is reflected by its markedly improved trapped magnetic field as compared with that of the samples in Example 1.

EXAMPLE 3

There were prepared five kinds of bulk materials comprising $Nd_{0.9}Ba_{2.1}Cu_3O_y$ as a superconductor and $Nd_{3.6}Ba_{2.4}Cu_{1.8}O_x$ phase (Nd422 phase) dispersed therein in an amount of 0, 10, 20, 30 and 40% by volume, respectively by means of the OCMG process.

As melting conditions, each of the starting materials of $Nd_{0.9}Ba_{2.1}Cu_3O_y$ was heated to 1040° C. for 20 minutes in a flowing mixed gas of argon and oxygen having an oxygen partial pressure of 0.1%, thereafter cooled to 1010° C. for 20 minutes, and after placing an MgO single crystal therein as a seed crystal, cooled to 900° C. at a cooling rate of 0.5° C./hr.

During the course of the growth of the crystals, large cracks were found on the samples having Nd422 phase contents of 0 and 10% by volume, respectively.

The samples in the form of a bulk superconductor having Nd422 phase contents of 20, 30 and 40% by volume, respectively, wherein no cracks were recognized, were annealed at 300° C. for 300 hours in flowing oxygen at atmospheric pressure.

Subsequently, each of the bulk superconductors thus obtained was classified into a group without resin impregnation, a group impregnated with a filler-incorporated resin in a vacuum vessel under the condition (1) in Example 1, and a group impregnated with a filler-incorporated resin in a vacuum vessel under the condition (2) therein.

Subsequently, each of the superconductors as samples was rapidly cooled to 100° K. A magnetic field of 10T was applied thereto at 100° K., then after cooling to 50° K., was gradually lowered, and finally removed. Thereafter, measurements were made of the magnetic field removed on the surface of the samples by the use of a Hall sensor.

As a result, it was confirmed that all the samples that were not subjected to resin impregnation under vacuum had been destroyed. On the other hand, the trapped magnetic field of the samples that were subjected to resin impregnation under vacuum, showed 3T, 6.5T and 5T for the samples having contents of Nd422 phase of 20, 30 and 40% by volume, respectively.

There was no difference in the values of the trapped magnetic field between the samples that were subjected to resin impregnation under the condition (1) and condition (2).

As mentioned above, cracks were observed in all the samples that were not subjected to resin impregnation under vacuum, but were not observed in all the samples that were subjected to resin impregnation under vacuum, all of which had a relatively high trapped magnetic field.

EXAMPLE 4

There were prepared five kinds of bulk materials comprising $YBa_2Cu_3O_y$ as a superconductor, a $Y_2BaCuO_5$ phase dispersed therein in an amount of 0, 10, 20, 30, and 40% by volume, respectively, and further, 10% by weight of Ag by means of the MTG process.

As melting conditions, each of the starting materials of $YBa_2Cu_3O_y$ was heated to 1050° C. for 20 minutes, thereafter cooled to 1000° C. for 30 minutes, and after placing a $YBa_2Cu_3O_y$ phase therein as a seed crystal, cooled to 900° C. at a cooling rate of 0.5° C./hr.

Melt grown samples were annealed at 400° C. for 250 hours in flowing oxygen at atmospheric pressure.

Subsequently, each of the bulk superconductors thus obtained was classified into a group without resin impregnation, a group impregnated with a filler-incorporated resin in a vacuum vessel under the following condition (1) in Example 1, and a group impregnated with a resin in a vacuum vessel under the following condition (2) therein.

Each oxide superconductive bulk body that had been subjected to the resin impregnation treatment was smoothened on the surface thereof by slightly grinding the outside surface. The oxide superconductive bulk body having the resin-impregnated layer was again placed in a vacuum vessel, and was covered on the outside surface with a filler-incorporated resin layer with a thickness of 0.5 mm under the condition same as the condition (2) in Example 1.

Subsequently, each of the superconductors as samples was cooled to 100° K. A magnetic field of 10T was applied thereto at 100° K., then, after cooling to 50° K., was gradually lowered, and finally removed. Thereafter, measurements were made of the magnetic field distribution on the surface of the sample by the use of a Hall sensor.

As a result, it was confirmed that all the samples which were not subjected to resin impregnation under vacuum and which had Y211 contents of 0 and 10%.by volume, were destroyed. The trapped magnetic field of the samples which had not been destroyed and which had Y211 contents of 20, 30 and 40% by volume, showed 1.5T, 3T and 2T, respectively.

On the other hand, all the samples which were subjected to resin impregnation under vacuum and covering treatment were not destroyed. The trapped magnetic field of the samples subjected to resin impregnation under vacuum, showed 2.5T, 3T, 4.5T, 5T, and 3T for the samples having contents of Y211 phase of 0, 10, 20, 30 and 40% by volume, respectively. From the comparison of the trapped magnetic fields among the samples which were not destroyed, it was seen that the samples which were subjected to resin impregnation under vacuum had higher trapped magnetic fields in all cases.

There was no difference in the values of the trapped magnetic field between the samples which were subjected to resin impregnation under the condition (3) and condition (4).

It can be seen from the foregoing that Y-based samples incorporated with Ag are also improved in trapped magnetic field by the resin impregnation under vacuum.

EXAMPLE 5

There were prepared five kinds of bulk materials comprising $Sm_{0.9}Ba_{2.1}Cu_3O_y$ as a superconductor, an $Sm_2BaCuO_6$ phase (Sm211 phase) dispersed therein in an amount of 0, 10, 20, 30 and 40% by volume, respectively and, further, 10% by weight of Ag by means of the OCMG process.

As melting conditions, each of the starting materials of $Sm_{0.9}Ba_{2.1}Cu_3O_y$ was heated to 1010° C. for 20 minutes in a stream of mixed gas of argon and oxygen having an oxygen partial pressure of 1%, thereafter cooled to 990° C. for 20 minutes, and after placing $SmBa_2Cu_3O_y$ crystals therein as a seed, cooled to 850° C. at a cooling rate of 0.5° C./hr.

During the course of the growth of the crystals, cracks, although not found visually, were observed in the sample not containing an Sm211 phase.

The samples in the form of a bulk superconductor having Sm211 phase contents of 10, 20, 30 and 40% by volume, respectively, wherein no cracks were recognized, were annealed at 350° C. for 200 hours in flowing oxygen at atmospheric pressure.

Subsequently, each of the bulk superconductors thus obtained was classified into a group without resin impregnation, a group impregnated with a filler-incorporated resin in a vacuum vessel under the condition (1) in Example 1, and a group impregnated with a resin in a vacuum vessel under the condition (2) therein.

Subsequently, each of the superconductors as samples was rapidly cooled to 100° K. A magnetic field of 10T was applied thereto at 100° K., then after cooling to 50° K., was gradually lowered, and finally removed. Thereafter, measurements were made of the magnetic field distribution on the surface of the sample by the use of a Hall sensor.

The trapped magnetic field of the samples which were not subjected to resin impregnation under vacuum and which had Sm211 contents of 10, 20, 30 and 40% by volume, showed 5T, 6T, 6T and 4T, respectively.

On the other hand, the trapped magnetic field of the samples which were subjected to resin impregnation under vacuum and which had Sm211 contents of 10, 20, 30 and 40% by volume, showed 6T, 9T, 9T and 7T, respectively.

There was no difference in the values of the trapped magnetic field between the samples subjected to filler-incorporated resin impregnation under condition (1) and condition (2).

It has been confirmed from the foregoing that Sm-based samples incorporated with Ag are also improved in trapped magnetic field by the resin impregnation under vacuum.

EXAMPLE 6

There was prepared a bulk material comprising $Sm_{0.9}Ba_{2.1}Cu_3O_y$ as a superconductor, an $Sm_2BaCuO_6$ phase (Sm211 phase) dispersed therein in an amount of 30% by volume, and further, 10% by weight of silver oxide by means of the OCMG process.

As melting conditions, the starting material of $Sm_{0.9}Ba_{2.1}Cu_3O_y$ was heated to 1010° C. for 20 minutes in a flowing mixed gas of argon and oxygen having an oxygen partial pressure of 1%, thereafter cooled to 990° C. for 20 minutes, and after placing $SmBa_2Cu_3O_y$ therein as a seed crystal, cooled to 850° C. at a cooling rate of 0.5° C./hr.

OCMG processed bulk superconductors were annealed at 350° C. for 200 hours in flowing oxygen at atmospheric pressure.

Subsequently, the bulk superconductors thus obtained were classified into a group without resin impregnation, a group impregnated with a filler-incorporated resin in a vacuum vessel under the condition (1) in Example 1, and a group impregnated with a resin in a vacuum vessel under the condition (2) therein.

Subsequently, each of the superconductors as samples was rapidly cooled to 100° K. A magnetic field of 10T was applied thereto at 100° K., then, after cooling to 77° K. by immersing in liquefied nitrogen, gradually lowered, and finally removed. Thereafter, measurements were made of the magnetic field distribution on the surface of the sample by the use of a Hall sensor.

Thereafter, the above-mentioned step was repeated, and the resultant trapped magnetic field was measured every time of repetition.

Figure 6:
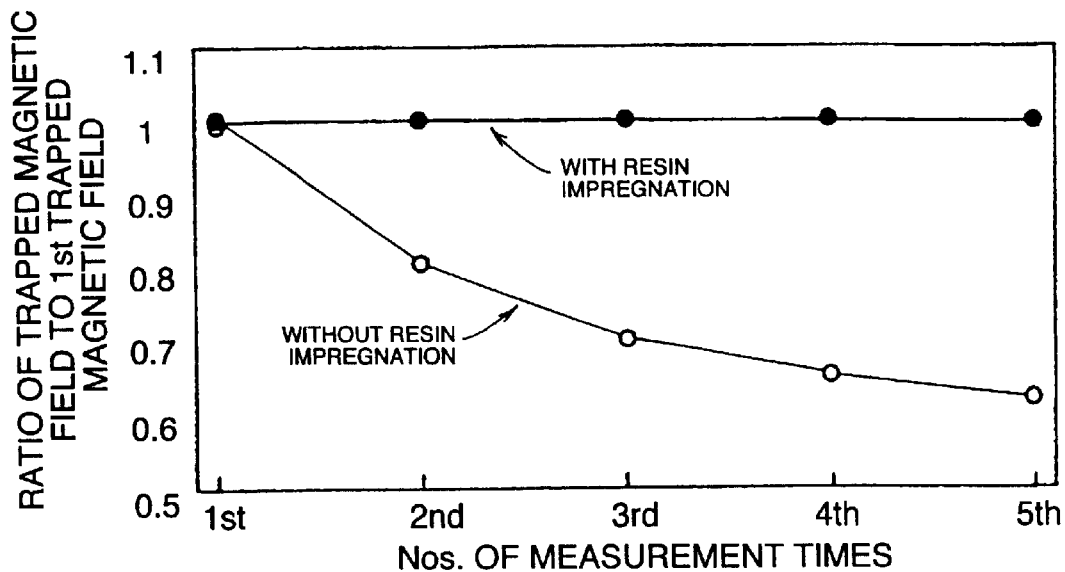
FIG. 6 is a graph showing a result of measurement of the trapped magnetic field of an Sm-based oxide superconductor as obtained in Example 6.

FIG. 6 illustrates the change in the trapped magnetic field with the number of repetitions on the basis of the trapped magnetic field measured at the first time defined [1] as the index.

It is clearly understood from FIG. 6, that the trapped magnetic field decreases with an increase in the number of repetitions in the case of the samples which were not subjected to resin impregnation under vacuum, whereas the trapped magnetic field does not change at all in the case of the samples which were subjected to filler-incorporated resin impregnation under vacuum.

There was no difference in the values of the trapped magnetic field between the samples which were subjected to filler-incorporated resin impregnation under the condition (1) and condition (2).

As indicated above, it has been confirmed that the samples which are subjected to resin impregnation under vacuum are effective in preventing the deterioration of trapped magnetic field due to repeated cooling or repeated application of electromagnetic force.

EXAMPLE 7

There were prepared bulk materials comprising $Gd_{0.9}Ba_{2.1}Cu_3O_y$ as a superconductor, a $Gd_2GaCuO_5$ phase (Gd211 phase) dispersed therein in an amount of 30% by volume, and further, 10% by weight of a silver oxide by means of the OCMG method.

As melting conditions, the starting material of $Gd_{0.9}Ba_{2.1}Cu_3O_y$ was heated to 1000° C. for 20 minutes in a flowing mixed gas of argon and oxygen having an oxygen partial pressure of 1%, thereafter cooled to 980° C. for 20 minutes, and after placing $GdBa_2Cu_3O_y$ crystals therein as a seed, cooled to 850° C. at a cooling rate of 0.5° C./hr.

After the growth of the crystals, the samples in the form of a bulk superconductor were annealed with oxygen at 350° C. for 200 hours in flowing oxygen at atmospheric pressure.

Subsequently, the bulk superconductors thus obtained were classified into a group without resin impregnation, a group impregnated with a filler-incorporated resin in a vacuum vessel under the condition (1) in Example 1, and a group impregnated with a resin in a vacuum vessel under the condition (2) therein.

Subsequently, each of the superconductors as samples was cooled to 100° K. A magnetic field of 10T was applied thereto at 100° K., then, after cooling to 77° K. by immersing in liquefied nitrogen, gradually lowered, and finally removed. Thereafter, measurements were made of the magnetic field distribution on the surface of the sample by the use of a Hall sensor.

Thereafter, the above-mentioned step was repeated, and the resultant trapped magnetic field was measured every time of repetition.

Figure 7:
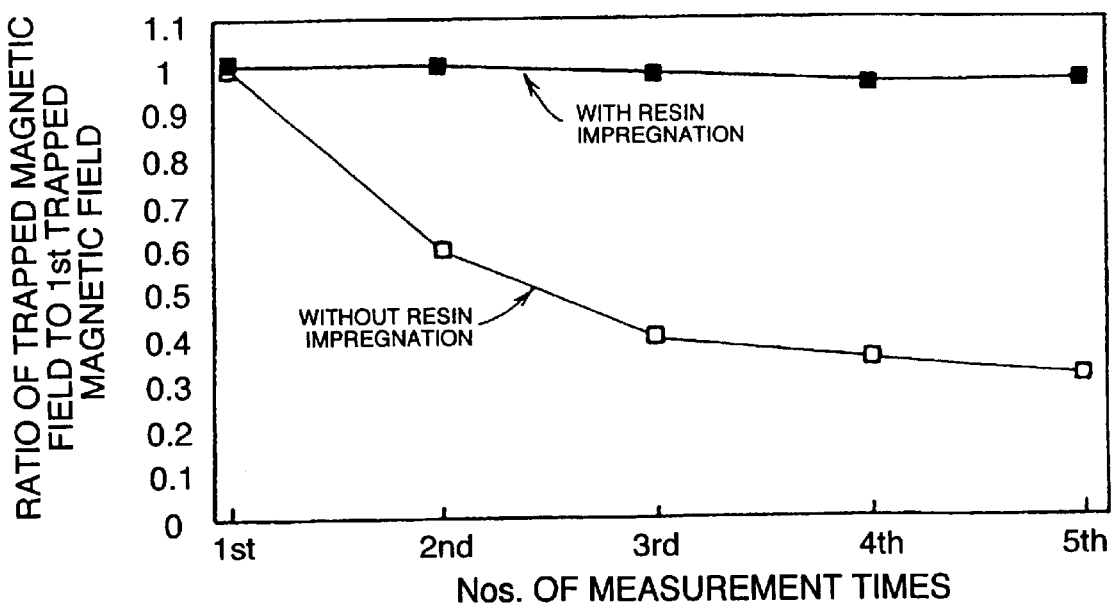
FIG. 7 is a graph showing a result of measurement of the trapped magnetic field of a Gd-based oxide superconductor as obtained in Example 7.

FIG. 7 illustrates the change in the trapped magnetic field with the number of repetitions on the basis of the trapped magnetic field measured at the first time defined [1] as the index.

It is clearly understood from FIG. 7 that the trapped magnetic field decreases with an increase in the number of repetitions in the case of the samples which were not subjected to resin impregnation, whereas the trapped magnetic field does not change at all in the case of the samples which were subjected to resin impregnation under vacuum.

There was no difference in the values of the trapped magnetic field between the samples which were subjected to resin impregnation under the condition (1) and condition (2).

As indicated above, it has been confirmed that the samples which are subjected to resin impregnation under vacuum are effective in preventing the deterioration of trapped magnetic field due to repeated cooling or repeated application of electromagnetic force.

EXAMPLE 8

There were prepared bulk materials comprising $YBa_2Cu_3O_y$ as a superconductor and a $Y_2BaCuO_5$ phase dispersed therein in an amount of 30% by volume by means of the MTG process.

As melting conditions, the starting materials of $YBa_2Cu_3O_y$ were heated to 1100° C. for 20 minutes, thereafter cooled to 100° C. for 30 minutes., and after placing $SmBa_2Cu_3O_y$ crystals therein as a seed crystal, cooled to 900° C. at a cooling rate of 0.5° C./hr.

Melt grown bulk superconductors were annealed with oxygen at 400° C. for 250 hours in a stream of flowing oxygen at atmospheric pressure.

Subsequently, the bulk superconductors thus obtained were classified into a group without resin impregnation, a group impregnated with a resin in a vacuum vessel under the condition (3) in Example 2, and a group impregnated with a resin in a vacuum vessel under the condition (4) therein.

Each oxide superconductive bulk body that had been subjected to the resin impregnation treatment was smoothened on the surface thereof by slightly grinding the outside surface. The oxide superconductive bulk body having the resin-impregnated layer was again placed in a vacuum vessel and covered on the outside surface with a filler-incorporated resin layer with a thickness of 0.2 mm under the same condition as condition (2) in Example 1.

Subsequently, each of the superconductors as samples was subjected to repeated steps comprising rapidly cooling to 77° K. by directly immersing in liquefied nitrogen, and raising the temperature up to room temperature.

As a result, cracks were visually observed by three times of repeated cooling and temperature raising in the samples which were not subjected to resin impregnation under vacuum and covering treatment, but were not observed even by twenty times of repeated rapidly cooling and temperature raising in the samples which were subjected to resin impregnation under a vacuum.

There was no difference in the values of the trapped magnetic field between the samples which were subjected to resin impregnation under the condition (3) and condition (4).

These results point out that the impregnated and covered resin not only enhances the strength of the sample, but also functions to alleviate the thermal strain by mitigating large differences in temperature between the surface and the inside of the sample which is caused by cooling the sample with liquefied nitrogen.

EXAMPLE 9

There were prepared five kinds of bulk materials comprising $YBa_2Cu_3O_y$ as a superconductor and a $Y_2BaCuO_5$ phase dispersed therein in an amount of 0, 10, 20, 30, and 40% by volume, respectively by means of the melt-textured-growth (MTG) process.

For the MTG process, according to an ordinary method, each of the starting materials of $YBa_2Cu_3O_y$ was heated to 1100° C. for 20 minutes, thereafter cooled to 1050° C. for 30 minutes, and after placing $SmBa_2Cu_3O_y$ crystals therein as a seed, cooled to 900° C. at a cooling rate of 0.5° C./hr.

Melt-grown samples were annealed at 400° C. for 250 hours in a stream of oxygen at atmospheric pressure.

Subsequently, each of the bulk superconductors thus obtained was classified into a group without resin impregnation, a group impregnated with a resin in a vacuum vessel under the following condition (1) in Example 1, and a group impregnated with a resin in a vacuum vessel under the following condition (2) therein.

Subsequently, by the use of a part of the groups of the bulk superconductors not subjected to resin impregnation treatment and all of the groups of the bulk superconductors subjected to resin impregnation treatment under the above mentioned conditions (1) and (2) as the objects of samples, each of the samples was tightly wrapped with a fabric made of glass fiber, followed by preheating to 70° C. Thereafter, a mixture of Bisphenol A type epoxy resin and aromatic polyamine as the curing agent, in a blending composition of 100:32 by weight, was poured onto the resultant fabric-covered bulk body so as to cover the same, and the bulk body was deaerated under a vacuum in a vacuum tank. Then, there was prepared an oxide superconductor having on the outside surface thereof, an adhesion cover layer of resin-impregnated fabric by curing at 80° C. for 6 hours in the atmospheric air.

The superconductor in any of the groups thus prepared (including those not subjected to resin impregnation treatment or covering treatment with resin-impregnated fabric) had the configuration illustrated in FIG. 3.

Subsequently, each of the superconductors as samples was rapidly cooled to 100° K. A magnetic field of 10T was applied thereto at 100° K., then after cooling to 50° K., gradually lowered, and finally removed. Thereafter, measurements were made of the magnetic field distribution on the surface of the sample by the use of a Hall sensor.

As a result, it was confirmed that all samples of the bulk bodies which were not subjected to resin impregnation treatment and covering treatment with resin-impregnated fabric, were destroyed. The trapped magnetic field of both the samples of the bulk bodies which were subjected to covering treatment with resin-impregnated fabric without resin impregnation treatment for the bulk bodies, and samples thereof which were subjected to resin impregnation treatment followed by covering treatment with resin-impregnated fabric, and which had Y211 contents of 0, 10, 20, 30 and 40% by volume, showed 2.5T, 3T, 4T, 4T and 3T, respectively.

There was no difference in the values of the trapped magnetic field between the samples which were subjected to covering treatment with resin-impregnated fabric without resin impregnation, and the samples which were subjected to resin impregnation treatment under the condition (1) or condition (2) followed by covering treatment with resin-impregnated fabric.

As the result of observation of the structure of the cross-section of the samples of bulk bodies that were subjected to resin impregnation, it was confirmed that the resin incorporated with the filler material impregnated mainly into microcracks and micropores of the bulk material from the surface towards the inside, whereby a resin-impregnated surface layer was formed on the surface layer.

As mentioned above, cracks were observed in all the samples that were not subjected to covering treatment with resin-impregnated fabric, but were not observed in the samples that were subjected to covering treatment with resin-impregnated fabric, with the result that a comparatively high trapped magnetic field was obtained in all the samples of bulk bodies. Needless to say, the difference in trapped magnetic field due to the difference in the content of Y211 phase, reflects the difference in the critical current density.

EXAMPLE 10

There were prepared five kinds of bulk materials comprising $Sm_{0.9}Ba_{2.1}Cu_3O_y$ as a superconductor and an $Sm_2BaCuO_5$ phase (Sm211 phase) dispersed therein in an amount of 0, 10, 20, 30, and 40% by volume, respectively, by means of the oxygen-controller-melt-growth (OCMG) process.

For the OCMG process, each of the starting materials of $Sm_{0.9}Ba_{2.1}Cu_3O_y$ was heated to 1200° C. for 20 minutes in a flowing mixed gas of argon and oxygen having an oxygen partial pressure of 1%, thereafter cooled to 1050° C. for 20 minutes and, after placing $NdBa_2Cu_3O_y$ crystals therein as a seed, cooled to 900° C. at a cooling rate of 0.5° C./hr.

During the course of the growth of crystals, large cracks were found in the samples having Sm211 phase contents of 0 and 10% by volume, and cracks, although not found visually, were observed in the sample having an Sm211 phase content of 20% by volume.

The samples in the form of a bulk superconductor having Sm211 phase contents of 30 and 40% by volume, wherein no cracks were recognized, were annealed at 350° C. for 200 hours in flowing oxygen at atmospheric pressure.

Subsequently, each of the resultant bulk superconductors, excluding a part thereof, was tightly wrapped with woven fabric made of glass fiber, placed in a vacuum tank and impregnated with the resin by the impregnation method of conditions (5) and (6). Thus, there was prepared an oxide superconductor which had a resin-impregnated layer on the surface portion thereof and had on the outside surface thereof, an adhesion-covering layer of resin-impregnated fabric.

Condition (5)—A bisphenol A type epoxy resin and an aromatic polyamine as the curing agent were mixed at a blending ratio by weight of 100:32, while preheating to 30° C., followed by deaeration under vacuum. Then, the bulk superconductor covered with fabric was preheated to 70° C., and was evacuated in a vacuum tank. The mixed resin was poured into the tank so as to cover the bulk body, and was cured by pressurizing over atmospheric pressure, and heating at 80° C. for 6 hours and at 120° C. for 2 hours.

Condition (6)—A bisphenol A type epoxy and an aromatic as the curing agent were mixed at a blending ratio by weight of 100:32, while preheating to 30° C. Then, the bulk superconductor was preheated to 70° C. The mixed resin was poured into the tank so as to cover the bulk body covered with fabric, followed by deaeration under vacuum in the tank. After sufficient defoaming, the impregnated resin was cured by heating under atmospheric pressure at 80° C. for 6 hours and at 120° C. for 2 hours.

Subsequently, each of the superconductors as samples that were subjected to covering treatment with resin-impregnated fabric and the samples that were not subjected to covering treatment with resin-impregnated fabric was rapidly cooled to 100° K. A magnetic field of 10T was applied thereto at 100° K., then after cooling to 50° K., was gradually lowered, and finally removed. Thereafter, measurements were made of the magnetic field distribution on the surface of the sample by the use of a Hall sensor.

As a result, it was confirmed that all the samples that were not subjected to resin impregnation under vacuum were destroyed.

On the one hand, the samples of the oxide superconductors which had a resin-impregnated layer on the surface portion thereof and had on the outside surface thereof, an adhesion-covering layer of resin-impregnated fabric by being subjected to covering treatment with resin-impregnated fabric, and which had Y211 contents of 30 and 40% by volume, showed high values of 8T and 6.5T, respectively.

There was no difference in the values of the trapped magnetic field between the samples that were subjected to resin impregnation under the condition (3) and condition (4).

As the result of observations of the structure of the cross-section of the samples that were subjected to covering treatment with resin-impregnated fabric, it was confirmed that the resin had impregnated mainly into microcracks and micropores of the bulk material from the surface of the oxide superconductive bulk body towards the inside, whereby a resin-impregnated surface layer was formed, and further the outside surface thereof was covered tightly with an adhesion-covering layer of resin-impregnated fabric.

Figure 8:
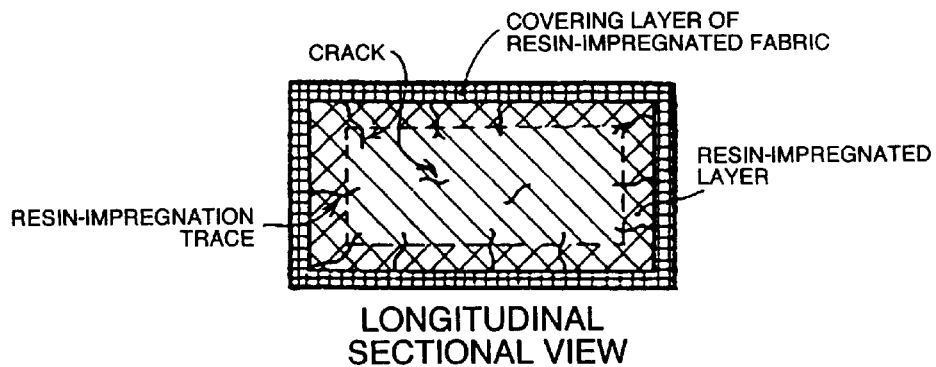
FIG. 8 is a schematic view showing the observed state taken along a longitudinal cross-section of the oxide superconductor obtained in Example 10.
Figure 9:
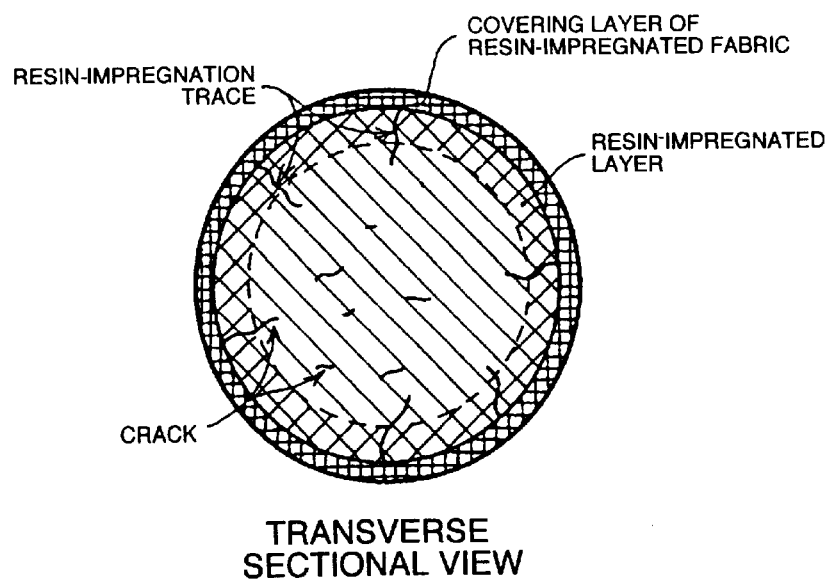
FIG. 9 is a schematic view showing the observed state taken along a lateral cross-section of the oxide superconductor obtained in Example 10.

FIG. 8 is a schematic view for the observed state of the longitudinal sectional view (equivalent to the sectional view taken on line A—A in the foregoing FIG. 3) for the sample of the oxide superconductor as obtained in this example, and FIG. 9 is a schematic view for observing the transverse sectional view (equivalent to the sectional view taken on line B—B in the foregoing FIG. 3) for the sample of the oxide superconductor as obtained in this example.

As mentioned above, cracks were observed in all the samples that were not subjected to a covering treatment with resin-impregnated fabric, but were not observed in the samples that were subjected to a covering treatment with a resin-impregnated fabric, all of which had a relatively high trapped magnetic field.

The difference in trapped magnetic field due to the difference in the content of Sm211 phase, reflects the difference in the critical current density. In addition, the excellent critical current characteristics of Sm-based superconductor is reflected by its markedly improved trapped magnetic field as compared with that of the samples in Example 1.

EXAMPLE 11

There were prepared five kinds of bulk materials comprising $Nd_{0.9}Ba_{2.1}Cu_3O_y$ as a superconductor and an $Nd_{3.6}Ba_{2.4}Cu_{1.8}O_x$ phase (Nd422 phase) dispersed therein in an amount of 0, 10, 20, 30 and 40% by volume, respectively by means of the OCMG process.

As the melting conditions, each of the starting materials of $Nd_{0.9}Ba_{2.1}Cu_3O_y$ was heated to 1040° C. for 20 minutes in a flowing mixed gas of argon and oxygen having an oxygen partial pressure of 0.1%, thereafter cooled to 1010° C. for 20 minutes, and after placing MgO single crystals therein as a seed crystal, cooled to 900° C. at a cooling rate of 0.5° C./hr.

During the course of the growth of the crystals, large cracks were found in the samples having Nd422 phase contents of 0 and 10% by volume, respectively.

The samples in the form of a bulk superconductor having Nd422 phase contents of 20, 30 and 40% by volume, respectively, wherein no cracks were recognized, were annealed at 300° C. for 300 hours in flowing oxygen at atmospheric pressure.

Subsequently, each of the resultant bulk superconductors, excluding a part thereof, was tightly wrapped with a woven fabric made of glass fiber, placed in a vacuum tank and impregnated with the filler-incorporated resin by the impregnation method as shown in conditions (1) and (2). Thus, there was prepared an oxide superconductor which had a filler-dispersed resin-impregnated layer on the surface portion thereof and had on the outside surface thereof, an adhesion-covering layer of filler-dispersed resin-impregnated fabric.

Subsequently, each of the superconductors as samples was cooled to 100° K. A magnetic field with 10T was applied thereto at 100° K., then after cooling to 50° K., was gradually lowered, and finally removed. Thereafter, measurements were made of the magnetic field removed on the surface of the samples by the use of a Hall sensor.

As a result, it was confirmed that all the samples that were not subjected to a covering treatment with resin-impregnated fabric had been destroyed. On the other hand, the trapped magnetic field of the samples that were subjected to a covering treatment with resin-impregnated fabric, showed 3T, 6.5T and 5T for the samples having contents of a Nd422 phase of 20, 30 and 40% by volume, respectively.

There was no difference in the values of the trapped magnetic field between the samples that were subjected to resin impregnation under the condition (1) and condition (2).

As mentioned above, cracks were observed in all the samples that were not subjected to resin impregnation under vacuum, but were not observed in any of the samples that were subjected to resin impregnation under vacuum, all of which had a relatively high trapped magnetic field.

EXAMPLE 12

There were prepared five kinds of bulk materials comprising $YBa_2Cu_3O_y$ as a superconductor, a $Y_2BaCuO_5$ phase dispersed therein in an amount of 0, 10, 20, 30, and 40% by volume, respectively, and further, 10% by weight of Ag by means of the MTG process.

As melting conditions, each of the starting materials of $YBa_2Cu_3O_y$ was heated to 1050° C. for 20 minutes, thereafter cooled to 1000° C. for 30 minutes, and after placing a $YBa_2Cu_3O_y$ phase therein as a seed crystal, cooled to 900° C. at a cooling rate of 0.5° C./hr.

Melt grown samples were annealed at 400° C. for 250 hours in flowing oxygen at atmospheric pressure.

Subsequently, each of the resultant bulk superconductors, excluding a part thereof, was tightly wrapped with woven fabric made of glass fiber, placed in a vacuum tank and impregnated with the filler-incorporated resin by the impregnation method as shown in conditions (1) and (2). Thus, there was prepared an oxide superconductor which had a filler-dispersed resin-impregnated layer on the surface portion thereof and had on the outside surface thereof, an adhesion-covering layer of filler-dispersed resin-impregnated fabric.

Subsequently, each of the superconductors as samples was rapidly cooled to 100° K. A magnetic field of 10T was applied thereto at 100° K., then after cooling to 50° K., was gradually lowered, and finally removed. Thereafter, measurements were made of the magnetic field distribution on the surface of the sample by the use of a Hall sensor.

As a result, it was confirmed that all the samples which were not subjected to covering treatment with resin-impregnated fabric and which had Y211 contents of 0 and 10% by volume, were destroyed. The trapped magnetic field of the samples which had not been destroyed and had Y211 contents of 20, 30 and 40% by volume, was 1.5T, 3T and 2T, respectively.

On the other hand, all the samples which were subjected to a covering treatment with resin-impregnated fabric were not destroyed. The trapped magnetic field of the samples subjected to resin impregnation under vacuum, was 2.5T, 3T, 4.5T, 5T, and 3T for the samples having contents of Y211 phase of 0, 10, 20, 30 and 40% by volume, respectively. From the comparison of the trapped magnetic fields among the samples which were not destroyed, it was seen that the samples which were subjected to resin impregnation under vacuum had higher trapped magnetic fields in all cases.

There was no difference in the values of the trapped magnetic field between the samples which were subjected to resin impregnation under the condition (1) and condition (2).

It can be seen that Y-based oxide superconductor samples incorporated with Ag are also improved in trapped magnetic field by the specific constitution in which each of the samples has a layer impregnated with a filler-dispersed resin on the surface portion thereof and also has on the outside surface thereof, an adhesion-covering layer of fabric impregnated with filler-dispersed resin.

EXAMPLE 13

There were prepared five kinds of bulk materials comprising $Sm_{0.9}Ba_{2.1}Cu_3O_y$ as a superconductor, an $Sm_2BaCuO_6$ phase (Sm211 phase) dispersed therein in an amount of 0, 10, 20, 30 and 40% by volume, respectively and further 10% by weight of Ag by means of the OCMG process.

As melting conditions, each of the starting materials of $Sm_{0.9}Ba_{2.1}Cu_3O_y$ was heated to 1010° C. for 20 minutes in a stream of a mixed gas of argon and oxygen having an oxygen partial pressure of 1%, thereafter cooled to 990° C. for 20 minutes, and after placing $SmBa_2Cu_3O_y$ crystal therein as a seed, cooled to 850° C. at a cooling rate of 0.5° C./hr.

During the course of the growth of crystals, cracks, although not found visually, were observed on the sample not containing Sm211 crystals.

The samples in the form of bulk superconductor having Sm211 crystal contents of 10, 20, 30 and 40% by volume, respectively, wherein no cracks were recognized, were annealed at 350° C. for 200 hours in flowing oxygen at atmospheric pressure.

Subsequently, each of the resultant bulk superconductors, excluding a part thereof, was tightly wrapped with woven fabric made of glass fiber, placed in a vacuum tank and impregnated with the filler-incorporated resin by the impregnation method as shown in conditions (1) and (2). Thus, there was prepared an oxide superconductor which had a filler-dispersed resin-impregnated impregnated layer on the surface portion thereof and had on the outside surface thereof, an adhesion-covering layer of filler-dispersed resin-impregnated fabric.

Subsequently, each of the superconductors as samples was rapidly cooled to 100° K. A magnetic field of 10T was applied thereto at 100° K., then after cooling to 50° K., was gradually lowered, and finally removed. Thereafter, measurements were made of the magnetic field distribution on the surface of the sample by the use of a Hall sensor.

The trapped magnetic field of the samples which were not subjected to covering treatment with a resin-impregnated fabric and which had Sm211 contents of 10, 20, 30 and 40% by volume, showed 5T, 6T, 6T and 4T, respectively.

On the other hand, the trapped magnetic field of the samples which were subjected to covering treatment with the resin-impregnated fabric and which had Sm211 contents of 10, 20, 30 and 40% by volume, was 6T, 9T, 9T and 7T, respectively.

There was no difference in the values of the trapped magnetic field between the samples subjected to resin impregnation under the condition (1) and condition (2).

It has been confirmed from the foregoing that Sm-based samples incorporated with Ag are also improved in trapped magnetic field by the resin impregnation under vacuum.

EXAMPLE 14

There was prepared a bulk material comprising $Sm_{0.9}Ba_{2.1}Cu_3O_y$ as a superconductor, an $Sm_2BaCuO_6$ phase (Sm211 phase) dispersed therein in an amount of 30% by volume, and further, 10% by weight of silver oxide by means of the OCMG process.

As melting conditions, the starting material of $Sm_{0.9}Ba_{2.1}Cu_3O_y$ was heated to 1010° C. for 20 minutes in a flowing mixed gas of argon and oxygen having an oxygen partial pressure of 1%, thereafter cooled to 990° C. for 20 minutes, and after placing $SmBa_2Cu_3O_y$ therein as a seed crystal, cooled to 850° C. at a cooling rate of 0.5° C./hr.

After the growth of crystals, the samples in the form of a bulk superconductor were annealed at 350° C. for 200 hours in flowing oxygen at atmospheric pressure.

Subsequently, each of the resultant bulk superconductors, excluding a part thereof, was tightly wrapped with woven fabric made of glass fiber, placed in a vacuum tank and impregnated with the filler-incorporated resin by the impregnation method as shown in conditions (1) and (2). Thus, there was prepared an oxide superconductor which had a filler-dispersed resin-impregnated layer on the surface portion thereof and had on the outside surface thereof, an adhesion-covering layer of filler-dispersed resin-impregnated fabric.

Subsequently, each of the superconductors as samples, including the samples which were not subjected to a covering treatment with the resin-impregnated fabric, was rapidly cooled to 100° K. A magnetic field of 10T was applied thereto at 100° K., then, after cooling to 77° K. by immersing in liquefied nitrogen, was gradually lowered, and finally removed. Thereafter, measurements were made of the magnetic field distribution on the surface of the sample by the use of a Hall sensor.

Thereafter, the above-mentioned step was repeated, and the resultant trapped magnetic field was measured every time of repetition.

Figure 10:
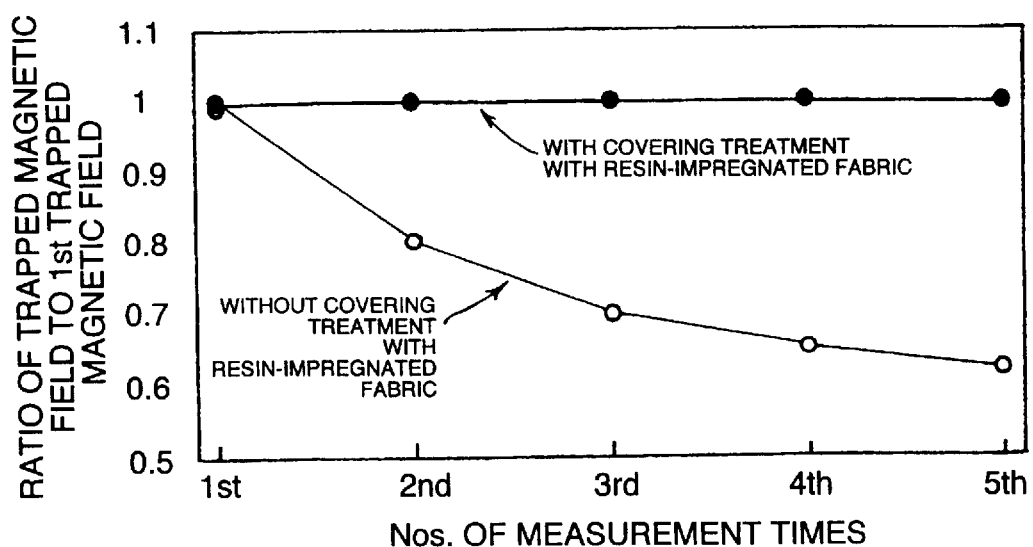
FIG. 10 is a graph showing a result of measurement of the trapped magnetic field of an Sm-based oxide superconductor as obtained in Example 14.

FIG. 10 illustrates the change in the trapped magnetic field with the number of repetitions on the basis of the trapped magnetic field measured at the first time defined [1] as the index.

It is clearly understood from FIG. 10, that the trapped magnetic field decreases with an increase in the number of repetitions, even in several times of measurements, in the case of the samples which were not subjected to a covering treatment with the resin-impregnated fabric, whereas the trapped magnetic field does not change at all in the case of the samples which were subjected to a covering treatment with the resin-impregnated fabric.

There was no difference in the values of the trapped magnetic field between the samples which were subjected to resin impregnation under the condition (1) and condition (2).

As indicated above, it has been confirmed that the samples which are subjected to a covering treatment with the resin-impregnated fabric, are effective in preventing the deterioration of the trapped magnetic field due to repeated cooling or repeated application of electromagnetic force.

EXAMPLE 15

There were prepared bulk materials comprising $Gd_{0.9}Ba_{2.1}Cu_3O_y$ as a superconductor, and a $Gd_2BaCuO_5$ phase (Gd211 phase) dispersed therein in an amount of 30% by volume by means of the OCMG method.

As melting conditions, the starting materials of $Gd_{0.9}Ba_{2.1}Cu_3O_y$ were heated to 1000° C. for 20 minutes in a flowing, mixed gas of argon and oxygen having an oxygen partial pressure of 1%, thereafter cooled to 980° C. for 20 minutes, and after placing $GdBa_2Cu_3O_y$ crystals therein as a seed, cooled to 850° C. at a cooling rate of 0.5° C./hr.

After the growth of the crystals, the samples in the form of a bulk superconductor were annealed at 350° C. for 200 hours in flowing oxygen at atmospheric pressure. Subsequently, each of the resultant bulk superconductors, excluding a part thereof, was tightly wrapped with woven fabric made of glass fiber, placed in a vacuum tank and impregnated with the filler-incorporated resin by the impregnation method as shown in conditions (1) and (2). Thus, there was prepared an oxide superconductor which had a filler-dispersed, resin-impregnated layer on the surface portion thereof and had on the outside surface thereof, an adhesion-covering layer of filler-dispersed, resin-impregnated fabric.

Subsequently, each of the superconductors as samples, including the samples which were not subjected to a covering treatment with the resin-impregnated fabric, was rapidly cooled to 100° K. A magnetic field of 10T was applied thereto at 100° K., then, after cooling to 77° K. by immersing in liquefied nitrogen, was gradually lowered, and finally removed. Thereafter, measurements were made of the magnetic field distribution on the surface of the sample by the use of a Hall sensor.

Thereafter, the above-mentioned step was repeated, and the resultant trapped magnetic field was measured every time of repetition.

Figure 11:
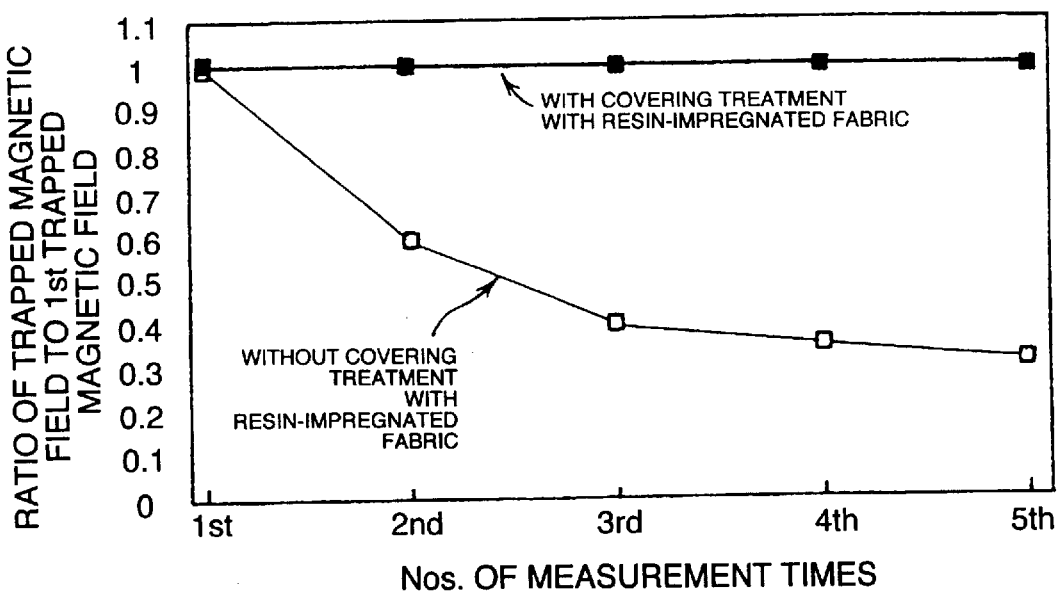
FIG. 11 is a graph showing a result of measurement of the trapped magnetic field of a Gd-based oxide superconductor as obtained in Example 15.

FIG. 11 illustrates the change in the trapped magnetic field with the number of repetitions on the basis of the trapped magnetic field measured at the first time defined [1] as the index.

It is clearly understood from FIG. 11, that the trapped magnetic field decreases with an increase in the number of repetitions, even in several times of measurements, in the case of the samples which were not subjected to a covering treatment with the resin-impregnated fabric, whereas the trapped magnetic field does not change at all in the case of the samples which were subjected to a covering treatment with the resin-impregnated fabric.

There was no difference in the values of the trapped magnetic field between the samples which were subjected to resin impregnation under the condition (1) and condition (2).

As indicated above, it has been confirmed that Gd-based samples which are subjected to resin impregnation under vacuum are effective in preventing the deterioration of trapped magnetic field due to repeated cooling or repeated application of electromagnetic force.

EXAMPLE 16

There was prepared a bulk material comprising $Sm_{0.9}Ba_{2.1}Cu_3O_y$ as a superconductor, an $Sm_2BaCuO_6$ phase (Sm211 phase) dispersed therein in an amount of 30% by volume, and further, 10% by weight of silver oxide by means of the OCMG process.

As melting conditions, the starting materials of $Sm_{0.9}Ba_{2.1}Cu_3O_y$ were heated to 1010° C. for 20 minutes in a flowing, mixed gas of argon and oxygen having an oxygen partial pressure of 1%, thereafter cooled to 990° C. for 20 minutes, and after placing $SmBa_2Cu_3O_y$ therein as a seed crystal, cooled to 850° C. at a cooling rate of 0.5° C./hr.

After the growth of the crystals, the samples in the form of a bulk superconductor were annealed at 350° C. for 200 hours in flowing oxygen at atmospheric pressure.

Subsequently, by the use of the bulk superconductors thus obtained, excluding a part thereof, there were prepared bulk superconductors which were tightly wrapped with woven fabric made of glass fiber and those which were tightly wrapped with woven fabric made of nylon, that is, the trade name of polyamide-based synthetic high polymeric fiber.

Thereafter, both the bulk superconductors fabric-wrapped and those not fabric-wrapped were placed in a vacuum tank and impregnated with the resin incorporated with a filler by the impregnation method in condition (2) in Example 1. As the result, there were prepared an oxide superconductor which had a filler dispersed, resin-impregnated layer on the surface portion thereof, an oxide superconductor which had a filler dispersed, resin-impregnated layer on the surface portion thereof, and had on the outside surface thereof, an adhesion-covering layer of glass fiber fabric impregnated with filler-dispersed resin and an oxide superconductor which had a filler-dispersed, resin-impregnated layer on the surface portion thereof, and had on the outside surface thereof, an adhesion-covering layer of the fabric made of polyamide-based synthetic high polymeric fiber impregnated with filler-dispersed resin.

Subsequently, each of the superconductors as samples was rapidly cooled to 100° K. A magnetic field of 10T was applied thereto at 100° K., then, after cooling to 77° K. by immersing in liquefied nitrogen, gradually lowered, and finally removed. Thereafter, measurements were made of the magnetic field distribution on the surface of the sample by the use of a Hall sensor.

Thereafter, the above-mentioned step was repeated, and the resultant trapped magnetic field was measured every time of repetition.

Figure 12:
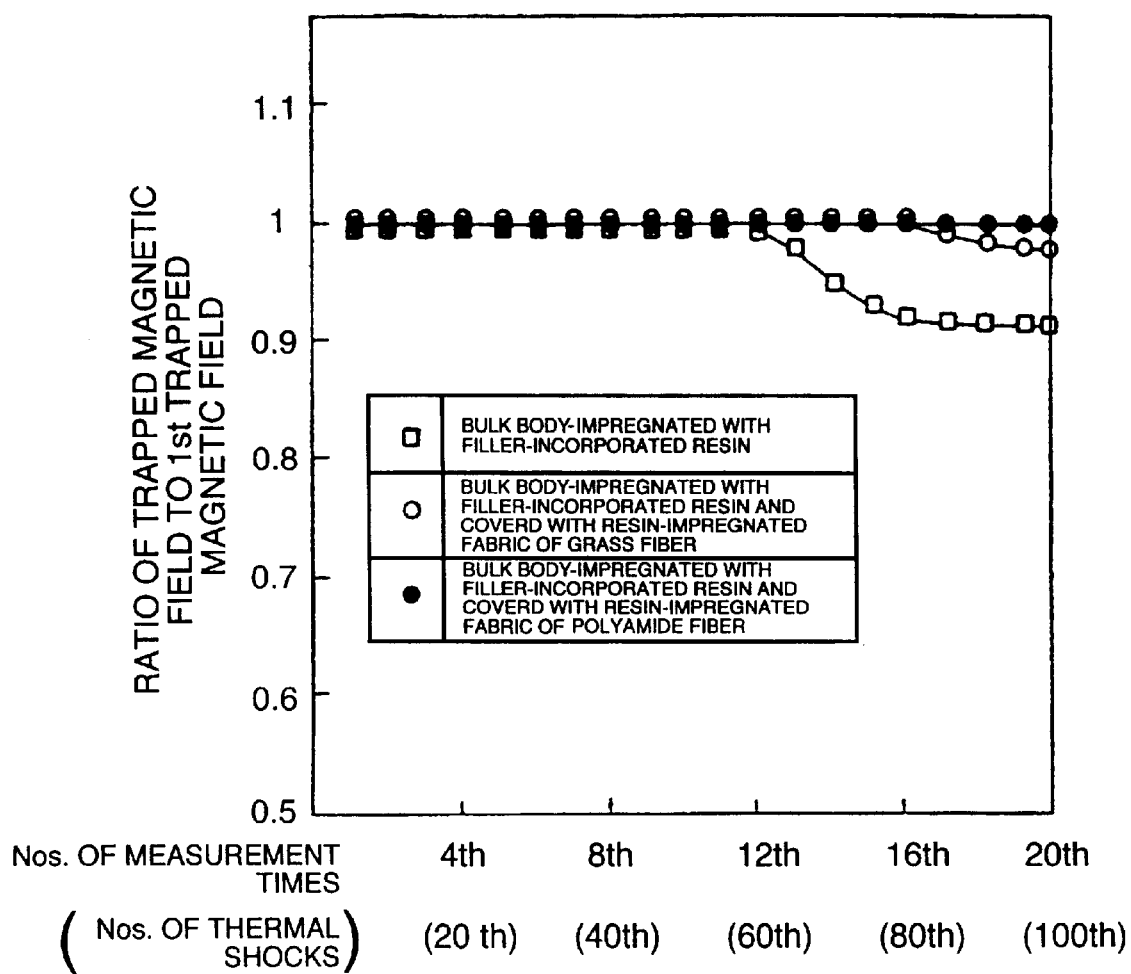
FIG. 12 is a graph showing a result of measurement of the trapped magnetic field of an Sm-based oxide superconductor as obtained in Example 16.

FIG. 12 illustrates the change in the trapped magnetic field with the number of repetitions on the basis of the trapped magnetic field measured at the first time defined [1] as the index.

It is clearly understood from FIG. 12, that the trapped magnetic field markedly decreases with an increase in the number of repetitions in the case of the oxide superconductor samples which had a filler-dispersed, resin-impregnated layer, but which were not subjected to a covering treatment with the resin-impregnated fabric, whereas the trapped magnetic field hardly decreases with an increase in the number of repetitions in the case of the samples which were subjected to a covering treatment with the resin-impregnated fabric. In particular, the trapped magnetic field does not show the tendency of decrease at all, even with an increase in the number of repetitions in the case of the oxide superconductor samples which had an adhesion-covering layer of the fabric made of polyamide-based synthetic high polymeric fiber.

As indicated above, it has been clarified that the oxide superconductor samples which are each provided, on the outside surface thereof, with an adhesion-covering layer of resin-impregnated fabric, are almost free from the deterioration of trapped magnetic field due to repeated cooling or repeated application of electromagnetic force, and are imparted with excellently stabilized properties.

It is believed that the above-mentioned results point out that said adhesion-covering layer of resin-impregnated fabric functions also in such a manner that said adhesion-covering layer not only imparts the samples with a high breaking strength by its binding force, but also alleviates the thermal strain by mitigating a great difference in temperature between the surface and the inside, said difference being caused at the time of cooling the sample with liquefied nitrogen.

EXAMPLE 17

Arrangements were made of a Y—Ba—Cu—)-based oxide superconductor comprising 30% by volume of $Y_2BaCuO_5$ crystals in an oxide superconductor of $YBa_2Cu_3O_y$, as obtained by the method in Example 9; an Sm—Ba—Cu—O-based oxide superconductor comprising 30% by volume of $Sm_2BaCuO_5$ crystals in an oxide superconductor of $Sm_{0.9}Ba_{2.1}Cu_3O_y$, as obtained by the method in Example 6; and a Gd—Ba—Cu—O -based oxide superconductor comprising 30% by volume of $Gd_2BaCuO_5$ crystals in an oxide superconductor of $Gd_{0.9}Ba_{2.1}Cu_3O_y$, as obtained by the method in Example 15.

Subsequently, part of the respective oxide superconductor bulk bodies was preserved as such as untreated samples, and the others were subjected to each of the combinational treatments as shown in Table 1.

The resin impregnation in the case of applying a covering layer of fabric was carried out by tightly wrapping the bulk body with the pertinent material, and then applying the foregoing condition (6) or condition (2) (in this case, the resin is poured so as to cover the bulk body).

Subsequently, both the untreated samples of superconductors and those treated in the above-mentioned manner, were rapidly cooled to 100° K. A magnetic field of 10T was applied thereto at 100° K., then after cooling to 77° K. by immersing in liquefied nitrogen, was gradually lowered, and finally removed. Thereafter, measurements were made of the magnetic field distribution on the surface of the samples by the use of a Hall sensor.

Thereafter, the above-mentioned step was repeated 20 times (5 thermal shocks were applied per one step), and the resultant trapped magnetic field was measured every time of repetition. The results of the measurements are also given in Table 1.

The figures indicating the results of the measurements for the trapped magnetic field, are each the ratio of the $20^{th}$ measured values to the reference values based on the trapped magnetic field measured at the first time defined [1] as the index.

TABLE 1

| Oxide superconductor bulk body applied | With or without resin impregnation | Type of covering layer of fabric | | | |
|---|---|---|---|---|---|
| | | Without covering layer of fabric | With covering layer of fabric made of glass fiber | With covering layer of fabric made of carbon fiber | With covering layer of fabric made of polyamide fiber |
| Y—Ba—Cu—O base | Without resin impregnation | 0.48 | — | — | — |
| | With epoxy resin impregnation | 0.95 | 0.99 | 1.0 | 1.0 |
| | With filler-incorporated epoxy resin impregnation | 0.97 | 1.0 | 1.0 | 1.0 |
| Sm—Ba—Cu—O base | Without resin impregnation | 0.39 | — | — | — |
| | With epoxy resin impregnation | 0.93 | 0.96 | 0.97 | 0.88 |
| | With filler-incorporated epoxy resin impregnation | 0.96 | 0.98 | 0.99 | 1.0 |
| Gd—Ba—Cu—O base | Without resin impregnation | 0.20 | — | — | — |
| | With epoxy resin impregnation | 0.92 | 0.96 | 0.97 | 0.98 |
| | With filler-incorporated epoxy resin impregnation | 0.96 | 0.98 | 0.99 | 1.0 |

Remarks Each figure in the table represents the ratio of the $20^{th}$ trapped magnetic field to the $1^{st}$ trapped magnetic field.

The treatments of the epoxy resin impregnation without a covering layer of fabric were carried out by the method of resin impregnation without covering the bulk body with the layer of fabric in the treatment of condition (6) as shown in Example 10.

The treatments of the filler-incorporated epoxy resin impregnation without a covering layer of fabric were carried out by the method of condition (2) as shown in Example 1.

The usefulness and capability of the oxide superconductor according to the present invention are obvious from the results given in Table 1.

Although the working examples have been described herein only as a copper oxide superconductor of Y-based, Sm-based, Nd-based and Gd-based, respectively, the excellent effects and advantages as those in the foregoing working examples have already been confirmed also in the case where use is made of the oxide superconductor of La-based, Eu-based, Dy-based, Ho-based, Br-based, Tm-based, and Yb-based, respectively, and the oxide superconductor compositely containing at least two rare earth elements exemplified above, said superconductors being impregnated or covered with a resin or the resin dispersedly incorporated with a filler material having a low value of linear thermal expansion coefficient (for instance, calcium carbonate, alumina, alumina hydrate, glass, talc and calcined gypsum, excluding fused quartz glass) or covered with a resin-impregnated fabric.

What is claimed is:

1. An oxide superconductor comprising an oxide superconductive bulk body which has a resin-impregnated layer comprising an oxide superconductive material and the resin, and an outside surface of which is covered with a resin layer dispersedly incorporated with a filler material having a low value of linear thermal expansion coefficient.

2. An oxide superconductor comprising an oxide superconductive bulk body which has on a surface portion thereof, a resin-impregnated layer comprising an oxide superconductive material and the resin dispersedly incorporated with a filler material having a low value of linear thermal expansion coefficient.

3. An oxide superconductor comprising an oxide superconductive bulk body which has on a surface portion thereof, a resin-impregnated layer comprising an oxide superconductive material and the resin dispersedly incorporated with a filler material having a low value of linear thermal expansion coefficient, and an outside surface which is covered with a resin layer dispersedly incorporated with the above-mentioned filler material having a low value of linear thermal expansion coefficient.

4. The oxide superconductor as set forth in claim 1, wherein the resin in the resin-impregnated layer comprises an epoxy-based resin.

5. A process for producing the oxide superconductor as set forth in claim 1, which comprises impregnating a resin into an oxide superconductive bulk body by bringing the resin in liquid form into contact with said bulk body at a reduced pressure, and thereafter coating the resin-impregnated bulk body with a resin in liquid form which is dispersedly incorporated with a filler material having a low value of linear thermal expansion coefficient.

6. A process for producing the oxide superconductor as set forth in claim 2, which comprises impregnating a resin into an oxide superconductive bulk body by bringing the resin in liquid form, which is dispersedly incorporated with a filler material having a low value of linear thermal expansion coefficient, into contact with said bulk body at a reduced pressure.

7. A process for producing the oxide superconductor as set forth in claim 2, which comprises impregnating a resin into an oxide superconductive bulk body by bringing the resin in liquid form, which is dispersedly incorporated with a filler material having a low value of linear thermal expansion coefficient, into contact with said bulk body at a reduced pressure, and thereafter coating the resin-impregnated bulk body with a resin in liquid form which is dispersedly incorporated with a filler material having a low value of linear thermal expansion coefficient.

8. An oxide superconductor comprising an oxide superconductive bulk body having a resin-impregnated layer comprising an oxide superconductive material and the resin at a surface portion thereof and an adhesively covering layer of resin impregnated fabric on an outside surface thereof.

9. The oxide superconductor as set forth in claim 8, wherein the fabric constituting said adhesively covering layer comprises fibers selected from the group consisting of glass fiber, carbon fiber, ceramic fiber, metal fiber, polyamide-based synthetic high polymeric fiber.

10. The oxide superconductor as set forth in claim 8, wherein the resin in the resin-impregnated layer comprises an epoxy-based resin.

11. The oxide superconductor as set forth in claim 9, wherein the resin is dispersedly incorporated with a filler material having a low value of linear thermal expansion coefficient.

12. A process for producing the oxide superconductor as set forth in claim 8, which comprises wrapping the surface of the oxide superconductive bulk body, and thereafter bringing the wrapped body at a reduced pressure into contact with a resin in liquid form.

13. A process for producing the oxide superconductor as set forth in claim 8 which comprises wrapping the surface of the oxide superconductive bulk body, and thereafter bringing the wrapped body preserved in an atmosphere of reduced pressure into contact with a resin in liquid form.

* * * * *